United States Patent [19]
Satoh et al.

[11] Patent Number: 5,568,628
[45] Date of Patent: Oct. 22, 1996

[54] STORAGE CONTROL METHOD AND APPARATUS FOR HIGHLY RELIABLE STORAGE CONTROLLER WITH MULTIPLE CACHE MEMORIES

[75] Inventors: Takao Satoh, Sagamihara; Hiroshi Ichinomiya, Kawasaki; Hisaharu Takeuchi, Odawara; Akira Yamamoto, Sagamihara, all of Japan

[73] Assignees: Hitachi, Ltd.; Hitachi Microcomputer System, Ltd., both of Tokyo, Japan

[21] Appl. No.: 165,989

[22] Filed: Dec. 14, 1993

[30] Foreign Application Priority Data

Dec. 14, 1992 [JP] Japan .................................. 4-353648

[51] Int. Cl.⁶ ...................................... G06F 12/08
[52] U.S. Cl. ......................... 395/440; 395/446; 395/460; 395/489; 395/403
[58] Field of Search ...................................... 395/427, 403, 395/440, 446, 447, 456, 460, 489; 364/200 MS File, 900 MS File

[56] References Cited

U.S. PATENT DOCUMENTS

| | | | |
|---|---|---|---|
| 4,423,479 | 12/1983 | Hanson et al. | 395/440 |
| 4,875,155 | 10/1989 | Iskiyan et al. | 395/440 |
| 4,956,803 | 9/1990 | Tayler et al. | 395/425 |
| 5,146,576 | 9/1992 | Beardsley et al. | 395/425 |
| 5,206,939 | 4/1993 | Yanai et al. | 395/400 |
| 5,235,692 | 8/1993 | Ayres et al. | 395/425 |
| 5,257,362 | 10/1993 | Menon | 395/425 |
| 5,283,884 | 2/1994 | Menon et al. | 395/440 |

*Primary Examiner*—Matthew M. Kim
*Attorney, Agent, or Firm*—Antonelli, Terry, Stout & Kraus

[57] ABSTRACT

A storage control unit is connected between a central processing unit having an interface for accessing a first disk unit into which data constructed of a plurality of variable length data records are stored in a first recording format, and a second disk unit into which data constructed of a plurality of fixed length data blocks are recorded in a second recording format. The storage control unit contains a plurality of first-level storage regions having a storage capacity equal to a track of the first disk unit, and the first-level storage regions have a plurality of cache memories constructed of a plurality of second-level storage regions having storage capacities equal to the fixed length blocks in the second recording format. In response to a data update request issued from the central processing unit, a control processor within the storage control unit judges whether or not the data of the fixed length data blocks containing the data records to be updated in the first recording format, are present in each of these cache memories. When there is such a cache memory having no data, the data of the fixed length data blocks containing the variable length data records to be updated are stored into this cache memory.

24 Claims, 24 Drawing Sheets

STORAGE CONTROL METHOD AND APPARATUS FOR HIGHLY RELIABLE STORAGE CONTROLLER WITH MULTIPLE CACHE MEMORIES

BACKGROUND OF THE INVENTION

The present invention generally relates to an external storage system used in an information processing system. More specifically, the present invention is directed to a storage control apparatus for controlling a data recording/reproducing operation for accessing a disk unit in which data is recorded in a fixed length block format by emulating a recording/reproducing operation for accessing a disk unit on which the data is recorded in a variable length block format.

In general, disk units are widely used as a data storage medium in information processing systems. There is a serious adverse influence caused by defects in the disk unit on the information processing system, and therefore it is very important to provide disk units having a high reliability.

One conventional approach to achieve a highly reliable storage unit is disclosed in, for example, JP-A-53-148928. In the storage subsystem for storing the data transferred from the central processing unit according to the conventional technique as described in JP-A-53-148928, the data to be stored is equally subdivided into segments whose quantity is smaller than that of the storage units employed by the storage subsystem. A check sum of the byte lengths identical to the segments is calculated by exclusive-OR-gating these subdivided segments, namely a parity is produced. The respective data segments and the parity segments are separately recorded on storage units which are different from each other in view of possible malfunction. Even when one storage unit would malfunction, the data which has been recorded on this malfunctioning storage unit could be reproduced, whereby a highly reliable storage control unit could be realized.

The above-described conventional technique corresponds to a highly reliable technique with employment of parity. As a consequence, the respective data segments and parity segments become the same byte number, namely fixed length data. It is preferable to record such fixed length data on the recording medium in accordance with the fixed length block format (fixed block architecture (FBA) format). On the other hand, since most of large-scaled information processing systems effectively utilize disk space, the data is normally recorded in accordance with such a variable length block format that the disk track recording format is divided, depending on the byte lengths of the records, namely the count-key-data (CKD) format. Thus, it is difficult to apply the above-described highly reliable technique to large-scaled information processing systems.

JP-A-1-306917 discloses one CKD emulation method for emulating the recording/reproducing of a disk unit on which data is recorded in the CKD format (referred to as a "CKD disk unit" hereinafter) by utilizing a disk unit on which data is recorded in the FBA format (will be referred to an "FBA disk unit" hereinafter). According to the conventional technique described in JP-A-1-306917, since the data recording to the disk unit is performed in the FBA format while maintaining the byte displacement relative positions of the CKD formatted records, the CKD formatted data is addressable. As a consequence, the highly reliable technique described in JP-A-53-148928 may be applied to an information processing system where data is recorded in the CKD format by way of this CKD emulation method. However, the CKD emulation method as described in JP-A-1306917 never considers defects or faults happening while the data is outputted to the disk unit. When the CKD disk unit is emulated by the FBA disk unit, the data boundary of the CKD formatted record is not coincident with that of the FBA formatted block. As a result, when an update request for the CKD formatted data is issued from the central processing unit, all CKD data containing data other than data portions corresponding to the CKD formatted record which should be updated, would be stored into the disk unit. Therefore, if defects happen to occur in the data writing operation to the disk unit, then there is a problem in that the CKD records other than the CKD formatted record which is required to be updated by the central processing unit, may be destroyed.

Meanwhile, the SCSI (Small Computer Systems Interface) ruled by ANSI (American National Standards Institute) has been proposed as a common interface capable of commonly utilizing various FBA disk units developed by several computer firms.

In this SCSI, both of an address and a transfer byte number of an FBA block which should be accessed are designated in a CDB (command descriptor block) in order to access data stored on a disk unit. Although accessing operations of the plural FBA blocks could be designated by a single CDB, the FBA blocks to be accessed must be logically continued with respect to each other. On the contrary, in the event of interface in accessing the CKD disk unit, a plurality of discontinued CKD records can be accessed by a single input/output request. Under such a circumstance, when the CKD emulation would be carried out by employing a SCSI as the interface of the FBA disk unit, a plurality of input/output requests must be issued to the disk unit. Furthermore, there are problems that not only a large overhead is required to issue such a CDB, but also a large latency may occur. Such problems may be solved by previously loading the data in the access range required by the central processing unit with respect to the data read request. However, the number of accessing operations to the disk unit cannot be reduced with respect to the data write request.

SUMMARY OF THE INVENTION

An object of the present invention is to provide a CKD emulation method capable of preventing data from being lost even when a defect happens to occur in a disk unit during a data write operation. Also, another object of the present invention is to provide a storage control method suitable for such a CKD emulation method.

To achieve the above-described objects, a storage control apparatus, according to one aspect of the present invention, is connected between a central processing unit having an interface to a disk unit on which data is recorded in a first recording format, and a disk unit on which data is recorded in a second recording format, and also is equipped with at least two cache memories. Preferably, each of these cache memories is subdivided into a plurality of regions corresponding to tracks of the first recording formatted disk unit, and a plurality of fixed length blocks on the second recording formatted disk unit are stored into the respective regions. Upon receipt of a data update request issued from the central processing unit, a control processor employed in the storage control unit judges whether or not the data of the fixed length data block in the second recording format, containing the first recording formatted records to be updated, is present in each of the plural cache memories. As a result of this judgement, when such a cache memory is present where the data of the fixed length data block in the second recording format containing the first recording formatted records to be updated is not present, the data of the fixed length data block containing the first recording formatted records to be updated is stored onto the cache memory without this data. The updating process of the first recording formatted record data is performed for the data stored in the plural cache memories. In one embodiment, the control processor stores the data updated on the cache memories into the storage unit in asynchronism with the updating request issued from the central processing unit. As a consequence, the data updating operations from the central processing unit are executed on the plural cache memories in the multiplex mode, and even when defects happen to occur while the data updated on the cache memories is stored into the disk unit, it could be prevented that this data is lost.

A storage control unit according to another aspect of the present invention, is such a storage control unit connected between a storage unit for storing data and a central processing unit for utilizing the data stored in the storage unit. This storage control unit includes a plurality of cache memories, a means for multiplexing the data on the storage unit to store the multiplexed data into the plural cache memories, and a means for varying a multiplexing degree to multiplex/store the data into the plural cache memories based on data accessing frequencies made from the central processing unit. As a consequence, a plurality of multiplexed cache memories can be effectively utilized.

DESCRIPTION OF THE PREFERRED EMBODIMENTS

Figure 1:
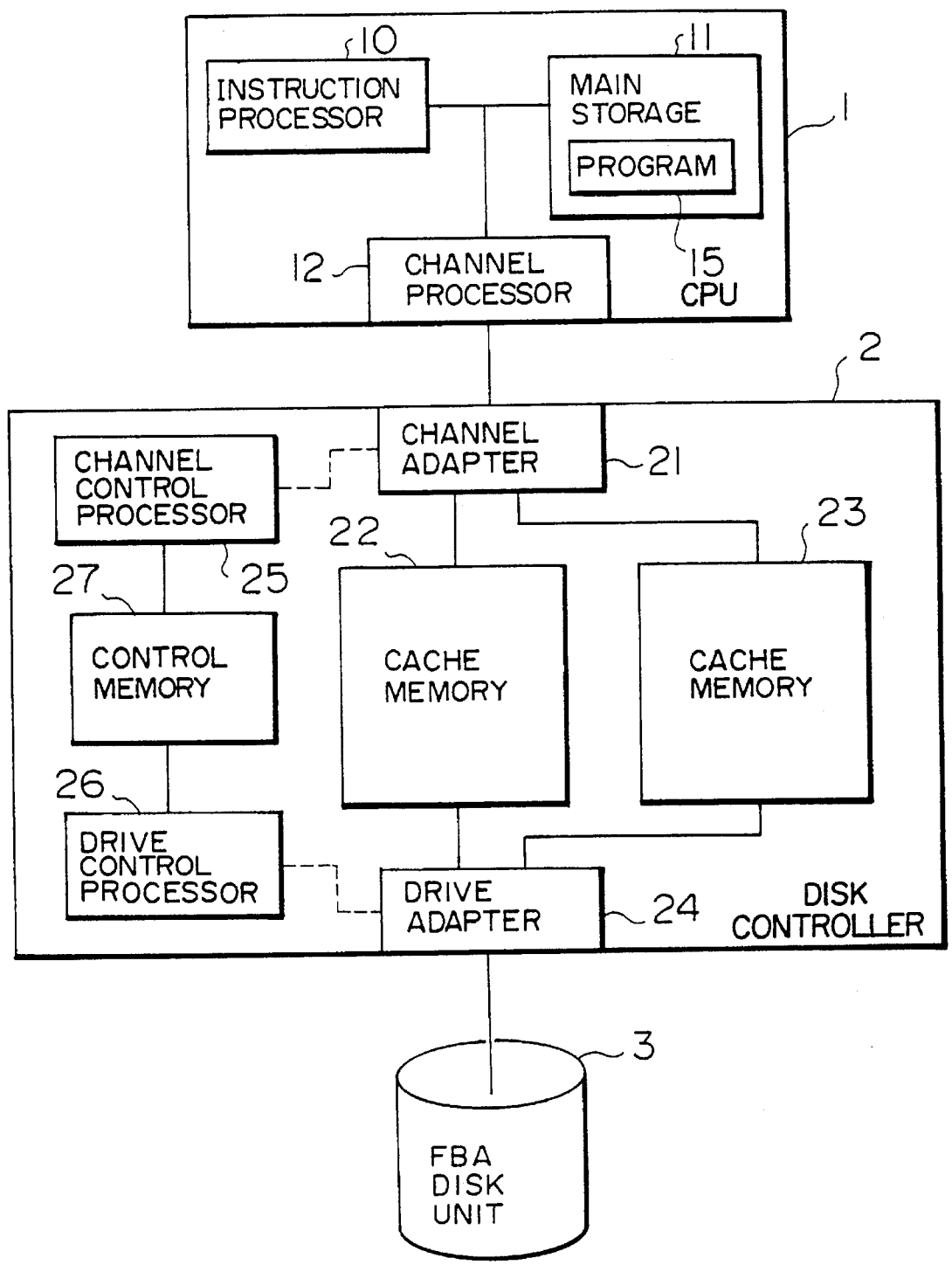
FIG. 1 is a schematic block diagram for showing an overall arrangement of a computer system according to a first embodiment of the present invention.

FIG. 1 is a block diagram for representing in a simple form an arrangement of a computer system according to a first embodiment of the present invention.

A central processing unit 1 is arranged by including an instruction processor 10, a main storage unit 11, and a channel processor 12. The main storage unit 11 stores a program 15 for using a CKD interface corresponding to the typical variable length block format interface (simply referred to as a "program" hereinafter). A process is executed by the instruction processor 10 in accordance with the program 15. The central processing unit 1 is connected via a disk controller 2 to a disk unit (FBA disk unit) 3 on which data is recorded in the fixed length block format.

The disk controller 2 is connected with the central processing unit 1 by a channel adapter 21, and connected with the FBA disk unit 3 by a drive adapter 24. Further, the disk controller 2 includes a plurality of cache memories 22, 23, a channel control processor 25, a drive control processor 26, and a control memory 27. In this embodiment, nonvolatile type cache memories nonvolatilized by battery power sources are employed as these cache memories 22 and 23. Similarly, the control memory 27 is non-volatilized by a battery power source and the like.

When the central processing unit 1 executes the program 15 to input and output the data between the FBA disk unit 3 and itself, a channel program is stored in the main storage unit 11 and a start input/output instruction is executed. Upon execution of this start input/output instruction, the channel processor 12 is initiated. The channel processor 12 reads out the channel program run on the main storage unit to transfer an input/output request containing a command and a parameter, which indicate contents of input/output operations, to the disk controller 2. The input/output request transferred from the central processing unit 1 is sent via the channel controller 21 to the channel control processor 25, and then processes corresponding to the respective commands are performed by the channel control processor 25. In this embodiment, the input/output request issued from the central processing unit 1 to the disk controller 2 is followed by the CKD interface, but cannot be utilized as an input/output request directly to the FBA disk unit 3. To realize the input/output request issued from the central processing unit 1 in accordance with the program 15 with respect to the FBA disk unit 3, an emulation program which is executed by the channel control processor 25 and the drive control processor 26 to emulate CKD format data recording, has been stored in the control memory 27.

The data transferred from the central processing unit 1 in accordance with the CKD interface are grouped in units of a track of the CKD disk unit (will be referred to a "CKD track") emulated in the disk controller 2, and then are stored into the FBA disk unit 3. For instance, when data in the CKD format having a physical track capacity of 60 KB is emulated by an FBA disk unit for a fixed length block having a capacity of 2 KB, the CKD track is mapped into 30 fixed length blocks on the FBA disk unit 3.

Figure 2:
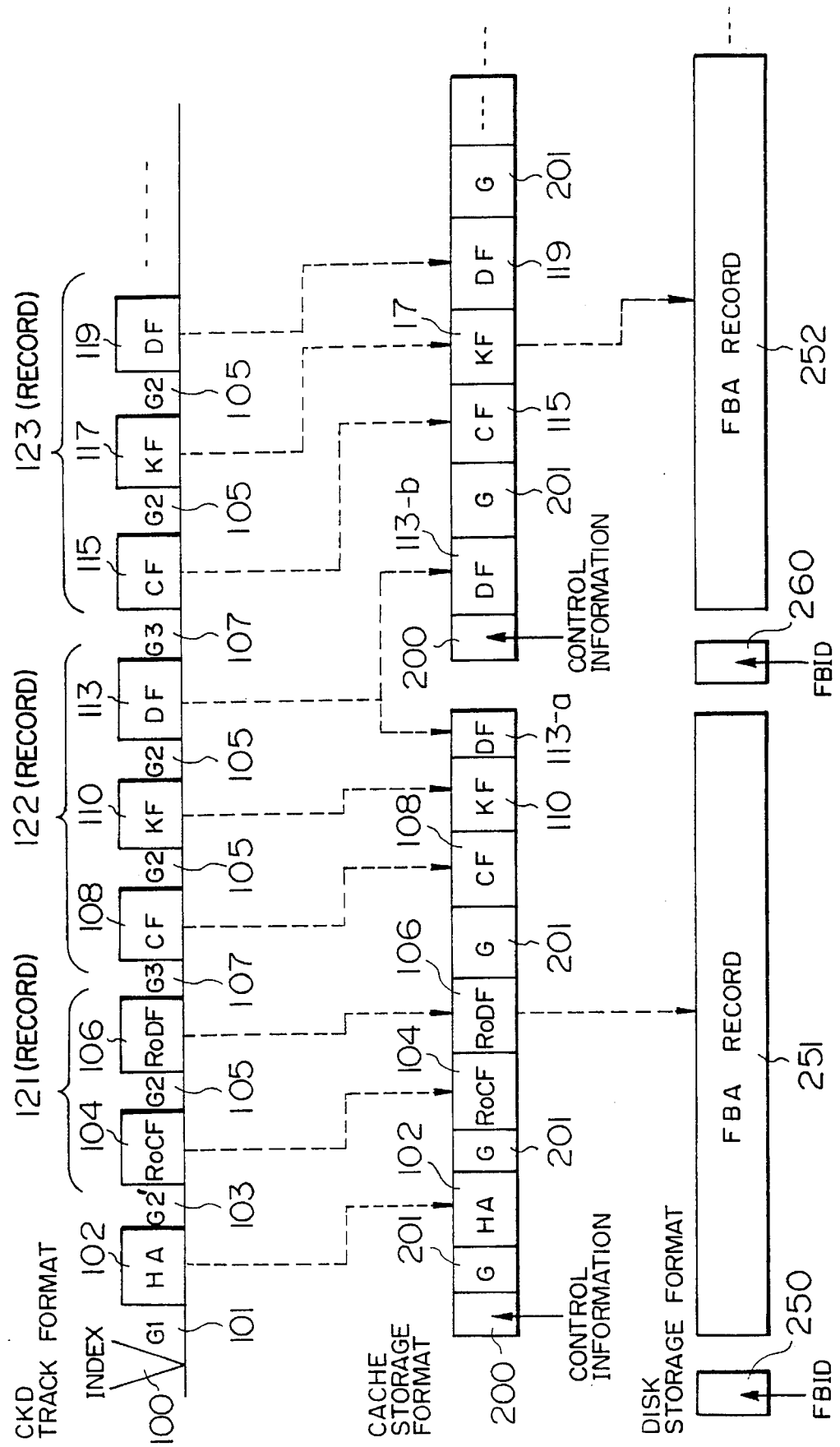
FIG. 2 schematically illustrates a relationship between a data storage format for a CKD disk unit and a data storage format for a cache memory and an FBA disk unit.

In FIG. 2, there is shown a relationship among the data storage format on the CKD disk unit, the cache memories 22, 23, and the data storage format to the FBA disk unit 3. On the CKD disk unit, starting positions of the respective tracks are indicated by "INDEX" 100. Each field on the track is sectioned by a gap. A gap "G1" 101 corresponds to a gap for separating "INDEX" 100 from "HA" 102. "HA" 102 is a first field of such a track for managing track conditions and track numbers. A gap "G2'" 103 corresponds to such a gap for separating "HA" 102 from a record "R0" 121 utilized as a record for controlling the system. A gap "G3" 107 is a gap for separating these records 121, 122 and 123 from each other. A gap "G2" 105 subdivides the respective fields within the respective records 121, 122, 123. Data records 122 and 123 are arranged by count fields (CF) 108, 115 indicative of conditions, positions, and lengths of the records; key fields (KF) 110 and 117 for storing information used to retrieve records to be accessed; and data fields (DF) 113 and 119 for storing data. The lengths of the key fields 110, 117 and of the data fields 113, 119 have been stored into the count fields 108, 115.

The emulation program employed in this embodiment is stored into the cache memories 22 and 23 by expanding the tracks on the CKD disk unit as a virtual CKD track in the format as shown in FIG. 2. As illustrated in FIG. 2, the virtual track is subdivided into fixed length blocks. Control information 200 is contained at a head of each block of the virtual CKD track. Into the control information 200, an address of a first count field (CF) within a block is stored. The respective CKD records within the virtual CKD track are separated from each other by the gap "G" 201. Also, on the virtual CKD track, the gap "G2" 105 used to separate the fields within the respective records on the CKD track has been deleted. To make both the HA field on the virtual CKD track and the start address of the respective CKD records coincident with the byte offset on the CKD track, the byte number of gap "G" 201 is made equal to a summation between the byte number of the corresponding gap "G3" 107 on the CKD track and the byte number of gap "G2" 105 within the record located before the gap "G3" 107. The blocks having fixed lengths which constitute the virtual CKD track are stored as FBA records 251, 252,—on the FBA disk unit 3. In this case, an FBID 250 corresponding to an identifier for physically identifying the FBA record 251 is positioned just before the FBA record 251.

A process flow of an input/output request issued from the central processing unit 1 will now be described as follows:
[DATA READING FROM EXTERNAL STORAGE UNIT]

Figure 3:
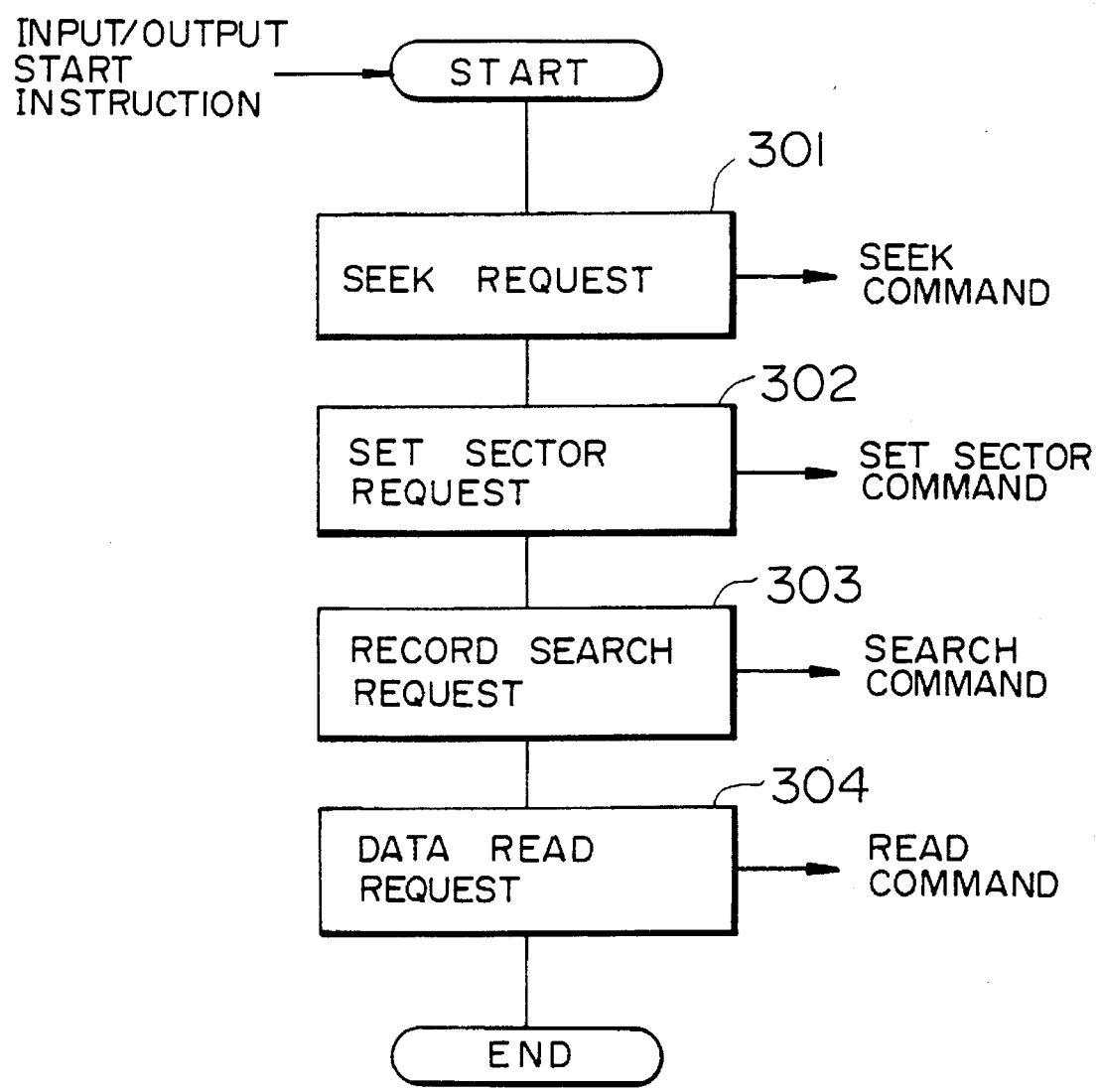
FIG. 3 is a flow chart of a channel program used in a data reading process.

FIG. 3 is a flow chart for explaining a data reading process executed in accordance with the channel program during a data reading process from the FBA disk unit 3. During the data reading process, first, a seek request is made from the central processing unit 1 to the disk controller 2 (step 301). As the seek request, a seek command and a seek address (cylinder address (CC) and track address (HH)) are transferred to the disk controller 2. In response to the seek request, the disk controller 2 moves a positioner (mechanism for moving a read/write head) of the disk unit 3 to the cylinder, and selects the read/write head. Next, the central processing unit 1 issues a set sector request to the disk controller 2 (step 302). In this case, a positioning operation of the read/write head is performed to the sector into which the head of the CKD record to be accessed has been stored. The sector request contains a set sector command and a sector number (S). When the process for performing the set sector request is completed, a record search request is issued (step 303). In the record search request, a search command is transferred to the disk controller 2, in which an identifier (CCHHR) for identifying the record to be searched and recorded on the count portion of the CKD record is employed as a search parameter. The disk controller 2 searches the requested record based on CC HHR. Upon completion of the record searching operation, a data read request is issued, and a target CKD record is transferred to the main storage unit of the central processing unit 1 (step 304). In the data read request, a read command is transferred to the disk controller 2.

Subsequently, a description will be made of processes executed at the respective steps based on the commands transferred to the disk controller.
[SEEK COMMAND PROCESS (Step 301)]

Figure 4:
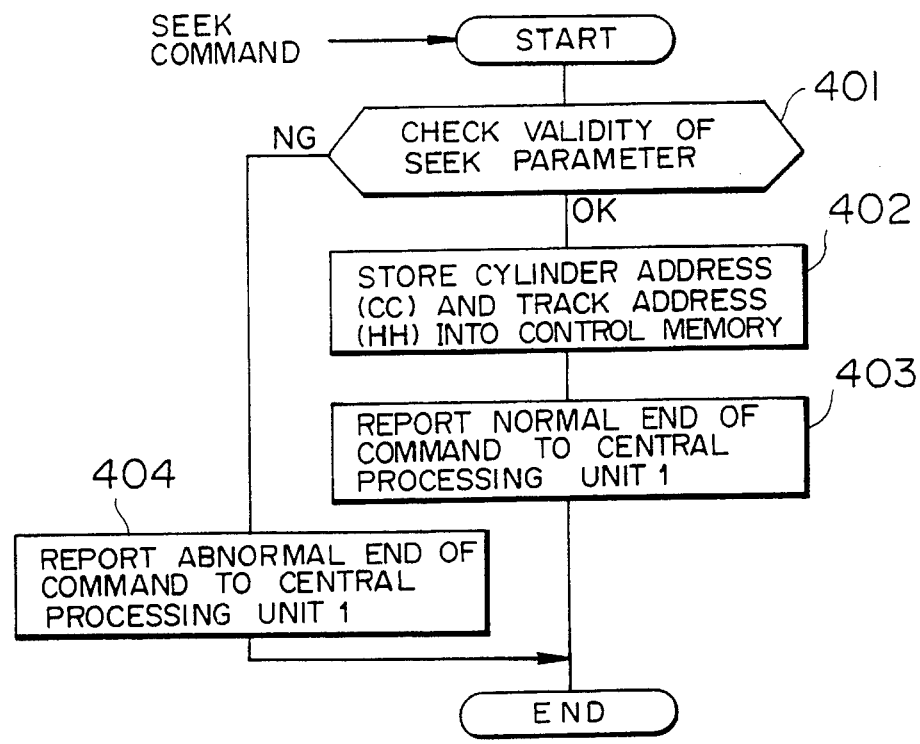
FIG. 4 is a flow chart of a seek command process.

FIG. 4 is a flow chart for explaining a process of a seek command executed by the channel control processor 25.

First, the channel control processor 25, which has received a seek command from the channel command from the channel processor 12, checks a validity of a seek parameter (step 401). As a result of this check, when a judgement is made that the seek parameter is invalid, the process operation is advanced to a step 404 at which a report is made to the central processing unit 1 that the seek command has extraordinarily ended, and this seek command process is completed. Upon receipt of the extraordinary end of the seek command from the disk controller 2, the channel processor of the central processing unit 1 interrupts the execution of the channel program and reports this extraordinary end of the channel program to the program 10. At the step 401, when another judgement is made that the seek parameter is valid, the process operation is advanced to a step 402 at which both of the cylinder address (CC) and the track address (TT) corresponding to the seek parameter are stored in the control memory 27. Subsequently, a report is issued to the central processing unit 1 that the seek command is normally ended, and then the process operation is accomplished (step 403).
[SET SECTOR COMMAND PROCESS (Step 302)]

Figure 5:
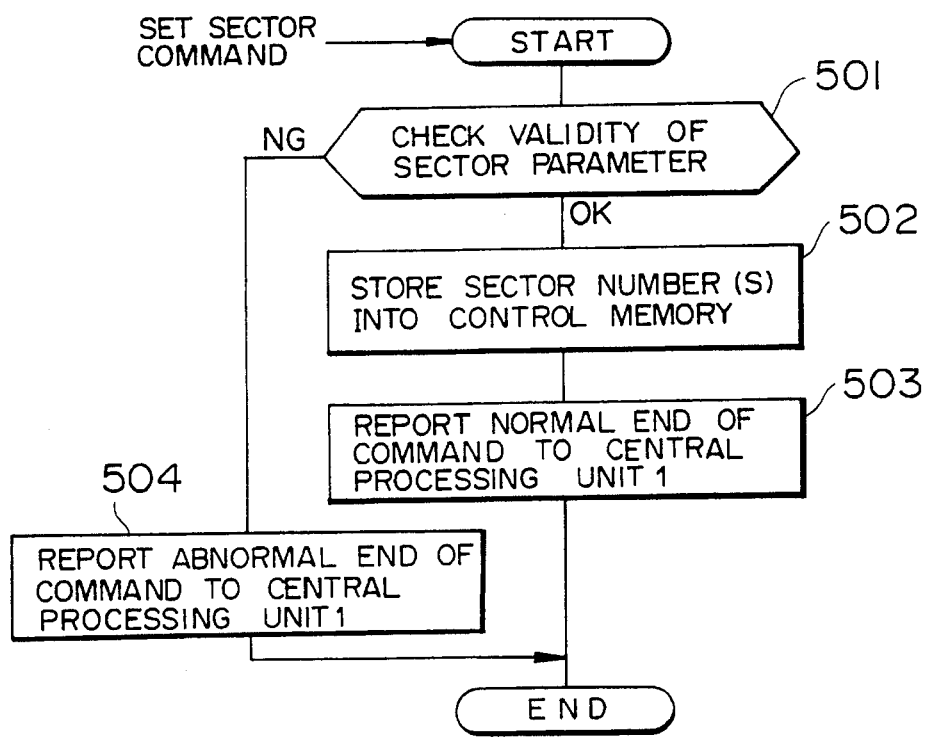
FIG. 5 is a flow chart of a set sector command process.

In response to a set sector command transferred from the central processing unit 1, the channel control processor 25 executes a set sector command process. In FIG. 5, there is shown a process sequence of the set sector command process.

The set sector command process is performed in a similar manner to the above-explained seek command process. First, a check is made to determine whether or not the sector number transferred as a parameter is valid (step 501). If the sector number is valid, then it is stored in the control memory 27 (step 502), and the normal end of the command is announced to the central processing unit 1, whereby the process is accomplished (step 503). On the other hand, when it is judged that the sector number is not valid at the step 501k, the disk controller 2 reports an abnormal end of the command to the central processing unit 1 and the process operation is completed (step 504). When the abnormal end of the command is reported from the disk controller 2, the central processing unit 1 interrupts the execution of the channel program and announces the abnormal end of the channel program to the program 10 in a similar manner to that of the seek command process.

[SEARCH COMMAND PROCESS (step 303)]

Figure 6:
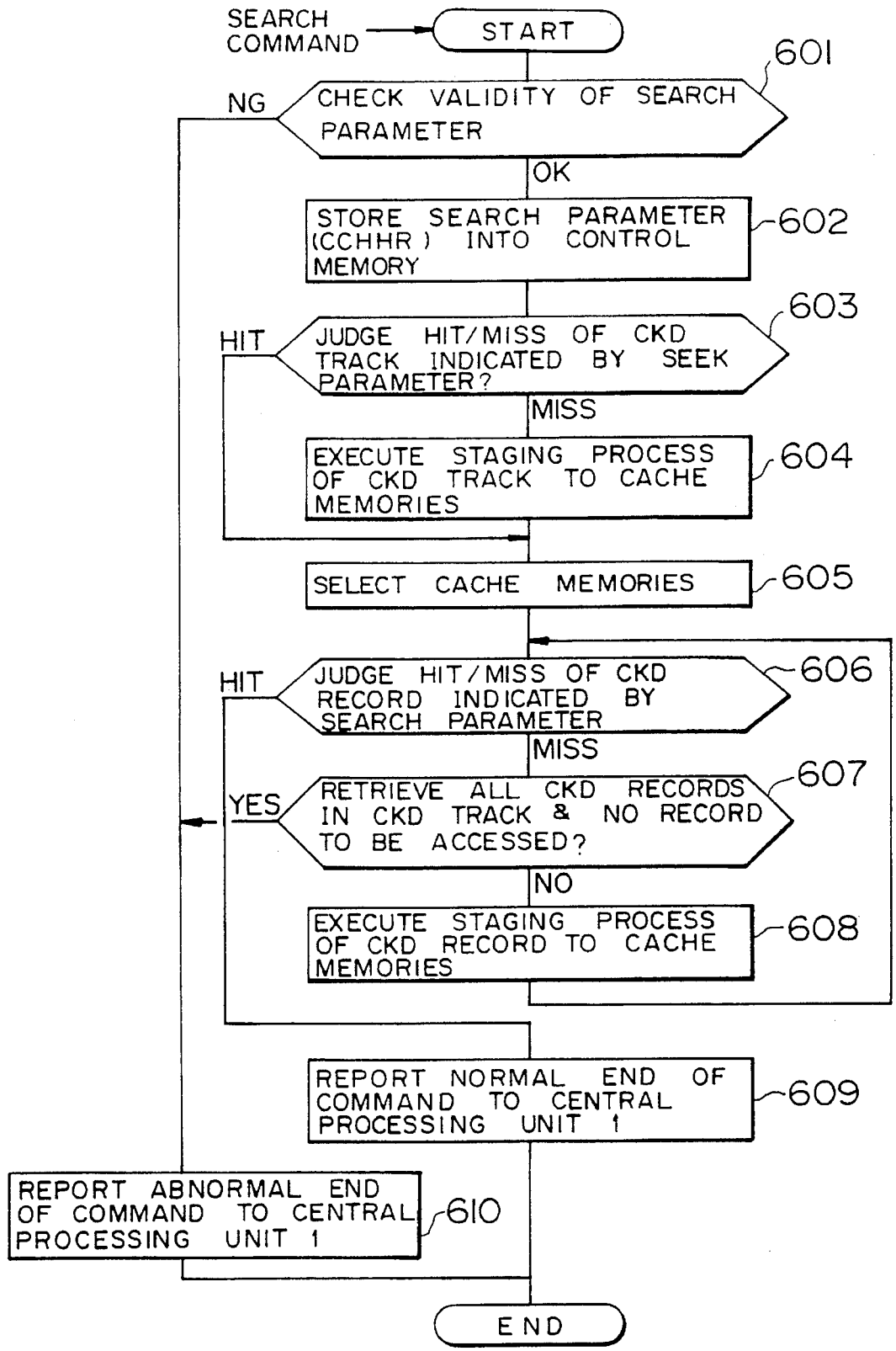
FIG. 6 is a flow chart of a search command process.

FIG. 6 shows a flow chart for explaining a seek command process executed by the channel control processor 25.

Upon receipt of a search command from the central processing unit 1, the channel control processor 25 checks the validity of the search parameter, transferred together with the search command (step 601). When the channel control processor 25 judges that the search parameter, the channel control processor 25 reports the abnormal end of this search command to the central processing unit 1 and accomplishes this process operation (step 610).

When it is judged that the search parameter is valid at the step 601, this search parameter is stored in the control memory 27 (step 602). Thereafter, a judgement is made as to whether or not the designated CKD track to be accessed is present in the cache memories 22 and 23 by referring to the seek parameter stored in the control memory 27 during the seek command process (step 603). This judgement is carried out with employment of a Hit/Miss judge table (will be explained later). As a result of this judgement, when it is judged that no CKD track to be accessed is present in the cache memories 22 and 23, namely a "Miss" occurs, the FBA record corresponding to the relevant CKD track is read out from the FBA disk unit 3, and a staging process for storing this FBA record into the cache memories 22 and 23 is performed (step 604). The FBA record read out from the FBA disk unit is stored into both of these cache memories 22 and 23. It should be noted the staging process executed at the step 604 will be discussed more in detail hereinafter.

Either when it is so judged at the step 603 that the CKD track to be accessed is present in the cache memories (namely "Hit"), or when the staging process defined at the step 604 is completed, a selection is made of any one of these cache memories 22 and 23. This selection is performed so that loads of the respective cache memories, for example, the number of utilization requests, are measured, and a cache memory having a light load is selected. Thereafter, the data on the cache memory 22 selected at the step 605 is read out to judge whether or not the CKD record to be accessed is present in the cache memory 22 (step 606). When the CKD record to be accessed is not present in the cache memory 22 (namely, in case of a "Miss" of the CKD record), another judgement is made as to whether or not all of the CKD records on the CKD track have been retrieved (step 607). To effectively utilize the cache memories and to reduce overhead in the staging process, even if a record with a low accessing frequency is a record within a single CKD track, there are some possibilities that such a record with a low accessing frequency is not stored into the cache memory. As a consequence, when the relevant record is not present in the cache memory, the overall CKD track must be retrieved. At a step 67, when it is judged that there is no record to be accessed by retrieving the overall CKD records on the CKD track, an abnormal end of the command is reported to the central processing unit 1 and the process operation is completed (step 610). When a confirmation is made at the step 607 that there is a record to be accessed which is not loaded in the cache memory 22, the process operation is advanced to a step 608. At this step 608, the CKD record which has not yet been stored in the cache memory 22 is read out from the FBA disk unit 3, and stored into the cache memory 22, and then the process operation is returned to the step 606. If another judgement is made at the step 606 that the CKD record to be accessed is present in the cache memory, then a normal end of the command is reported to the process apparatus 1 to accomplish the process operation (step 609).

[READ COMMAND PROCESS (step 304)]

Figure 7:
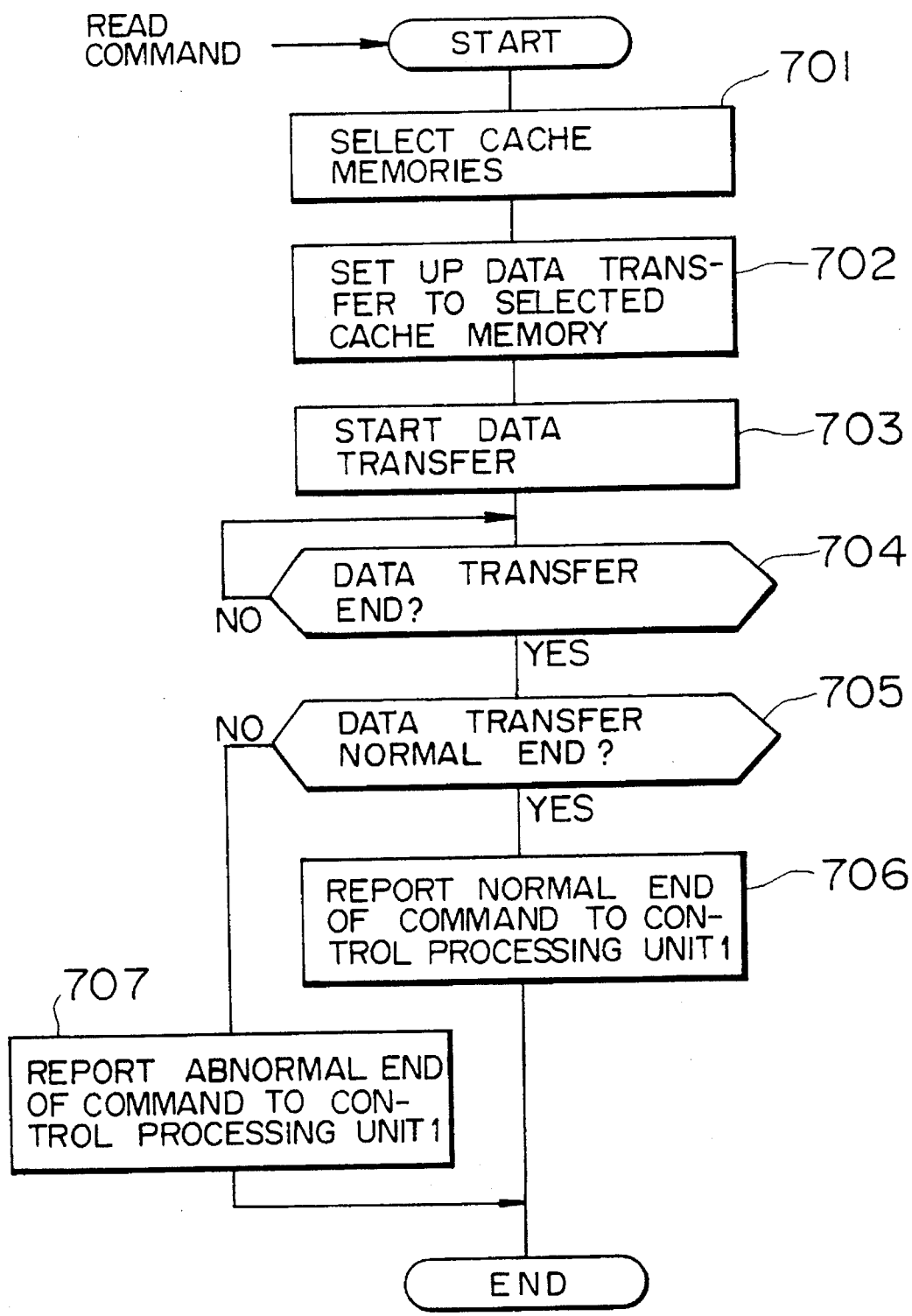
FIG. 7 is a flow chart of a read command process.

FIG. 7 is a flow chart for indicating a process sequence of a read command process executed by the channel control processor 25.

Upon receipt of a read command from the central processing unit 1, the channel control processor 25 first selects one of the cache memories 22 and 23 (step 701). It should be noted that in the following description, the cache memory 22 is selected by the channel control processor 25. Next, a data transfer is set up to the cache memory 22 selected at the step 701 (step 702). In the set up process, the storage address and the transfer byte number of the CKD record from which the data is transferred, with respect to the channel controller 21, are set. A CKD record storage address is used to set an address of a field within the cache memory 22, which is transferred in the CKD record retrieved during the search command process. As a target of transfer, a selection is made from a control field, a key field, and a data field, depending upon the sort of read command received from the central processing unit 1. For instance, in case the read command received from the central processing unit 1 corresponds to a "READ DATA command" for requesting a transfer of a data portion, both the head address of the relevant data field and the length of this data field stored in the corresponding count field are set into the channel adapter 21. After the set up process has been performed at the step 702, an instruction is issued to the channel adapter 21 such that the data transfer is commenced (step 703).

The channel adapter 21 which receives the start instruction of data transfer from the channel control processor 25, reads out the data indicated by the CKD record storage address set at the step 702 from the cache memory 22, and then transfers the read data to the central processing unit 1, during which the channel control processor 25 monitors the completion of the data transfer process effected by the channel adapter 21 (step 704).

Upon detection of the completion of data transfer at the step 704, the channel control processor 25 judges whether or not the data transfer is accomplished in the normal condition (step 705). When the channel adapter 21 makes such a judgement that the data transfer is completed in the normal condition, this channel adapter 21 indicates a the normal end of the read command to the central processing unit 1 (step 706). On the other hand, when the channel adapter 21 makes another judgement that the data transfer has ended in an abnormal condition, the abnormal end of the read command is reported to the central processing unit 1 and then the process operation is completed (step 707). The channel processor of the central processing unit 1 which has received the end of the read command from the disk controller 2, judges that the channel program has ended, since there is no subsequent process, and also reports the completion of the input/output process to the program 10.

[STAGING PROCESS FROM FBA DISK UNIT TO CACHE MEMORY]

The above description has been made, in Summary, concerning the data read process from the FBA disk unit 3. Now, the staging process from the FBA disk unit 3 to the cache memories 22 and 23 will be explained more in detail, which constitutes a portion of the above-described search command process. The staging process from the FBA disk unit 3 into the cache memories 22, 23 is executed by the drive control processor 26 in response to an instruction issued from the channel control processor 25. The instruction issued from the channel control processor 25 to the drive control processor 26 is performed by transferring a request block (RB) via the control memory 27.

Figure 8:
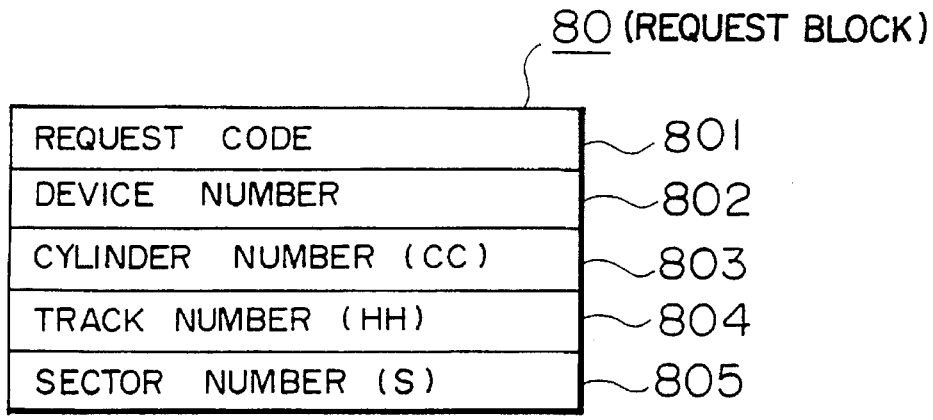
FIG. 8 is a structural diagram of a request block transferred to a drive control processor during a load process to a cache memory.

In FIG. 8, there is shown a logical structure of a request block (RB) 80 transferred from the channel control processor 25 to the drive control processor 26. In case of staging process requests to the cache memories 22 and 23, the channel control processor 25 sets a code indicative of "a staging process request" into at request code 801 with RB80. A "device number" a "cylinder number" a "track number" and a "sector number" which define an FBA block to be staged, are set as parameters into a device number 802, a cylinder number (CC) 803, a track number (HH) 804, and a sector number (S) 805, respectively. It should be noted that the above-described parameters represent information related to a CKD disk unit to be emulated. The channel control processor 25 sets RB80 into the control memory 27, sets a bit of a desired bit position of a POST controlling bit map for a slot control block (SCB) present on the control memory 27, and waits for the completion of the process effected by the drive control processor 26.

Figure 9:
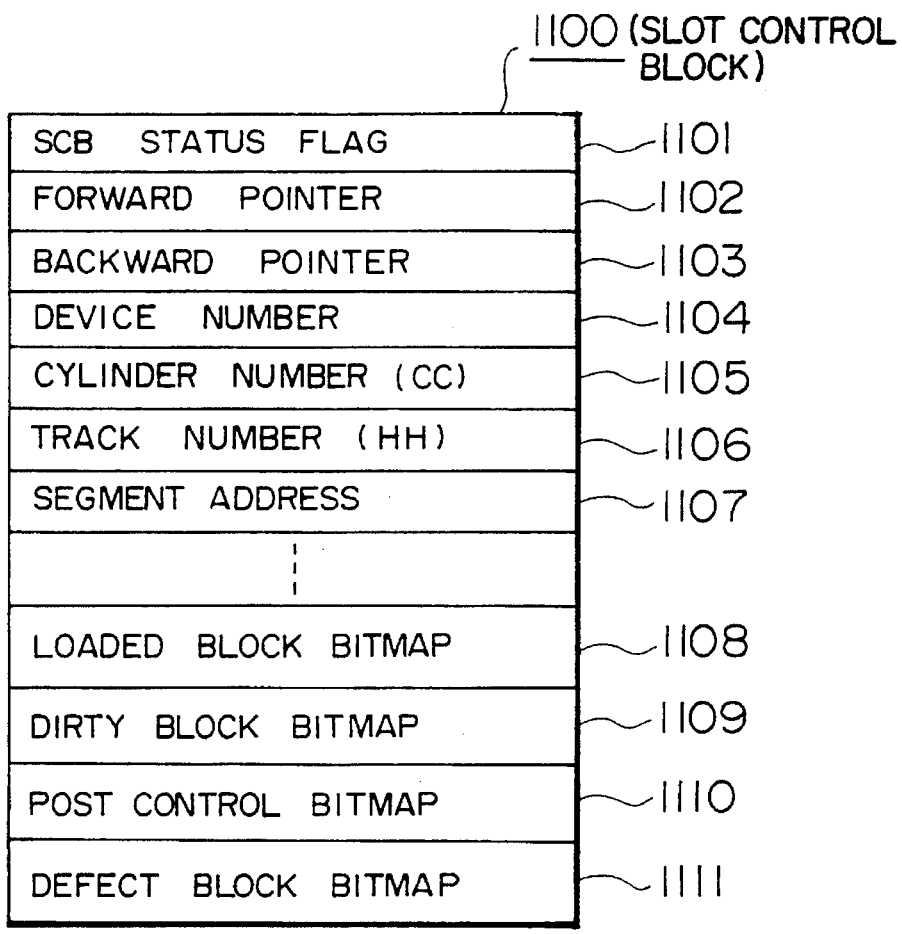
FIG. 9 is a structural diagram of a slot control block.

The cache memories 22 and 23 have been subdivided into units referred to as "cache slots". A single cache slot is constructed of at least a single cache segment. The maximum length of a cache slot is a dimension capable of storing data for 1 track of the CKD disk unit which is to be emulated. For example, when the size of a CKD track to be emulated is 60 KB and the size of a cache segment is 16 KB, 4 cache segments are required to store all data for 1 track. Each of these cache slots is managed by the slot control block (SCB) provided in the control memory 27. In FIG. 9, there is shown a structural example of a SCB. A slot control block (SCB) 1100 holds information related to a corresponding single cache slot. Such slot control blocks are provided on the control memory 27, the number of which is equal to the number of cache slots that constitute a single cache memory. An SCB status flag 1101 of SCB 1100 holds information representative of a condition of the corresponding cache slot, namely the valid/invalid status of data about the corresponding cache slot, and indicating whether or not update data is present in the corresponding cache slot. A forward pointer 1102 and a backward pointer 1103 are pointers for pointing to a replaceable SCB chain, a forward SCB, or a backward SCB chain when the replaceable SCB chain and the like are constituted. A device number 1104, a cylinder number (CC) 1105, and a track number (HH) 1106 provide information about the CKD track expanded into the virtual CKD track stored in the corresponding cache slot, and correspond to a device number, a cylinder number (CC), and a track number (HH), which are designated by the search parameter and the like. In a segment address 1107, an address of each cache segment within the corresponding cache slot is held. A sufficient number of segment addresses 1107 are provided to be able to hold the address of all cache segments within the cache slot. Into a loaded FBA block bit map 1108, there is information indicating whether or not the FBA blocks are present in the cache memories 22 and 23 in accordance with the FBA block for storing the CKD track designated by the device number 1104, cylinder number 1104, and track number 1105. Information used to specify the FBA block containing the data updated by the data update request issued from the central processing unit 1 within the cache slot, is stored in a dirty FBA block bit map 1109. Other SCB 1100 contains a post control block bit map 1110 for holding information used in the post control, and a defect block bitmap 1111 for specifying a defect FBA block. The loaded FBA block bitmap 1108, the dirty FBA block bitmap 1109, the post control bitmap 1110, and the defect FBA block bitmap 111 are constructed of plural bits, respectively, and each bit corresponds to a single FBA block.

Figure 10:
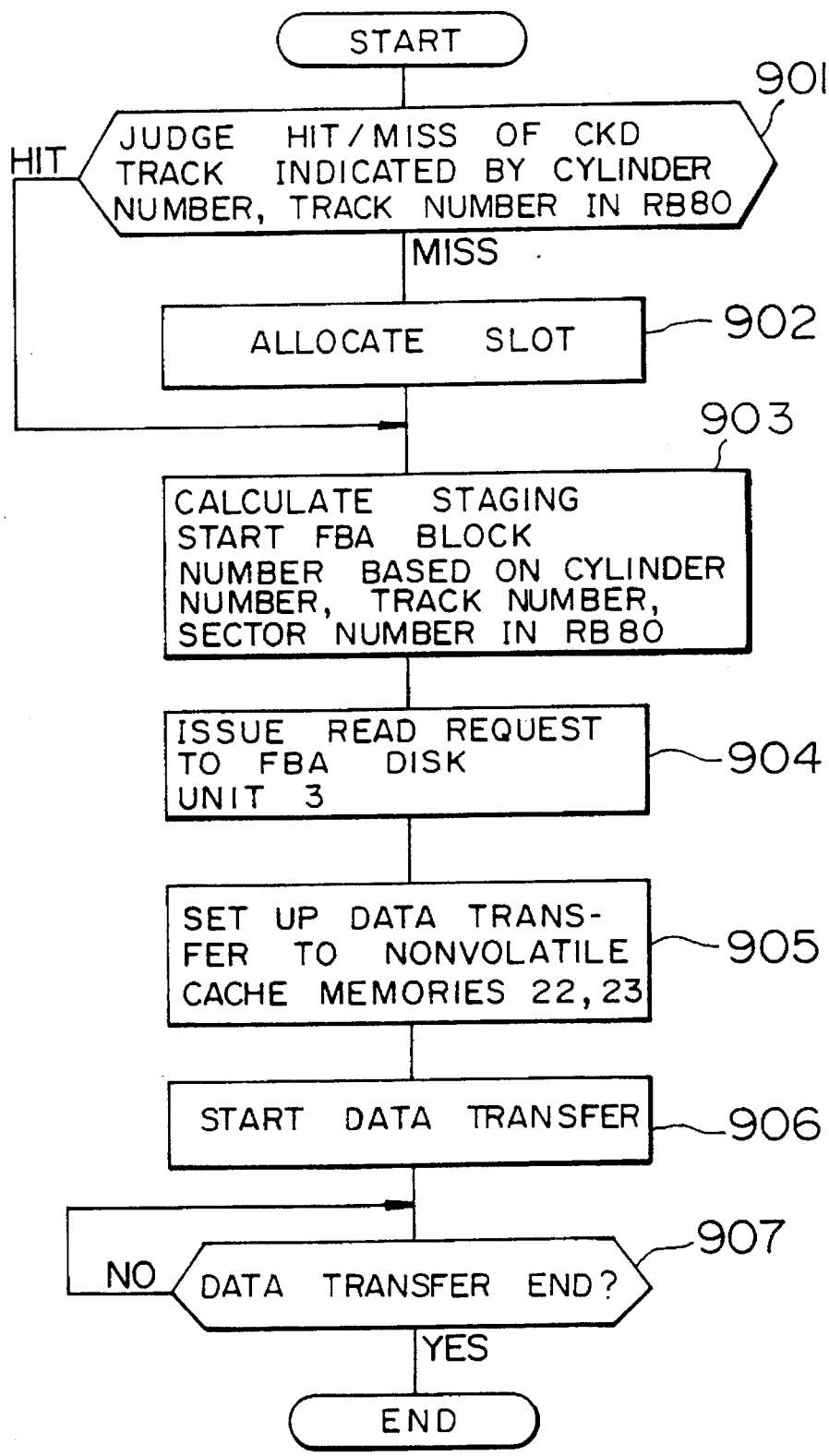
FIG. 10 is a flow chart of a load process to a cache memory.

FIG. 10 is a flow chart for indicating a process sequence of a staging process executed by the drive control processor 26. When a staging process request issued by RB80 to the cache memories is accepted, the drive control processor 26 will judge whether or not the CKD track indicated by the cylinder number 802 and the track number 804 set within RB80 is present on the cache memories 22 and 23, namely will perform a Hit/Miss judgement (step 901). In this Hit/Miss judgement process, a process is carried out which is similar to the previously explained search command process performed by the channel control processor 25 defined at the step 603. A concrete explanation about the Hit/Miss judgement process will now be made.

During the Hit/Miss judgement process, a Hit/Miss judge table provided in the control memory 27 is employed. The Hit/Miss judge table is constructed of a device table 1000, a cylinder table 1001, and a track table 1002. Entries of the device table 1000 are present in accordance with the CKD disk unit to be emulated. The addresses of the cylinder table 1001 are set to the respective entries of the device table. The cylinder table is provided in correspondence with the CKD disk unit to be emulated. The entries of the cylinder table 1001 correspond to the cylinders of the relevant CKD disk unit, into which the addresses of the track table 1002 have been stored. The track table 1002 is provided in correspondence with the respective cylinders of the CKD disk unit, by which the CKD track may be related to the cache slot for storing therein this CKD track. Into the respective entries of the track table 1002, an address of SCB 1100 for storing the CKD track corresponding to this entry has been stored.

Figure 11:
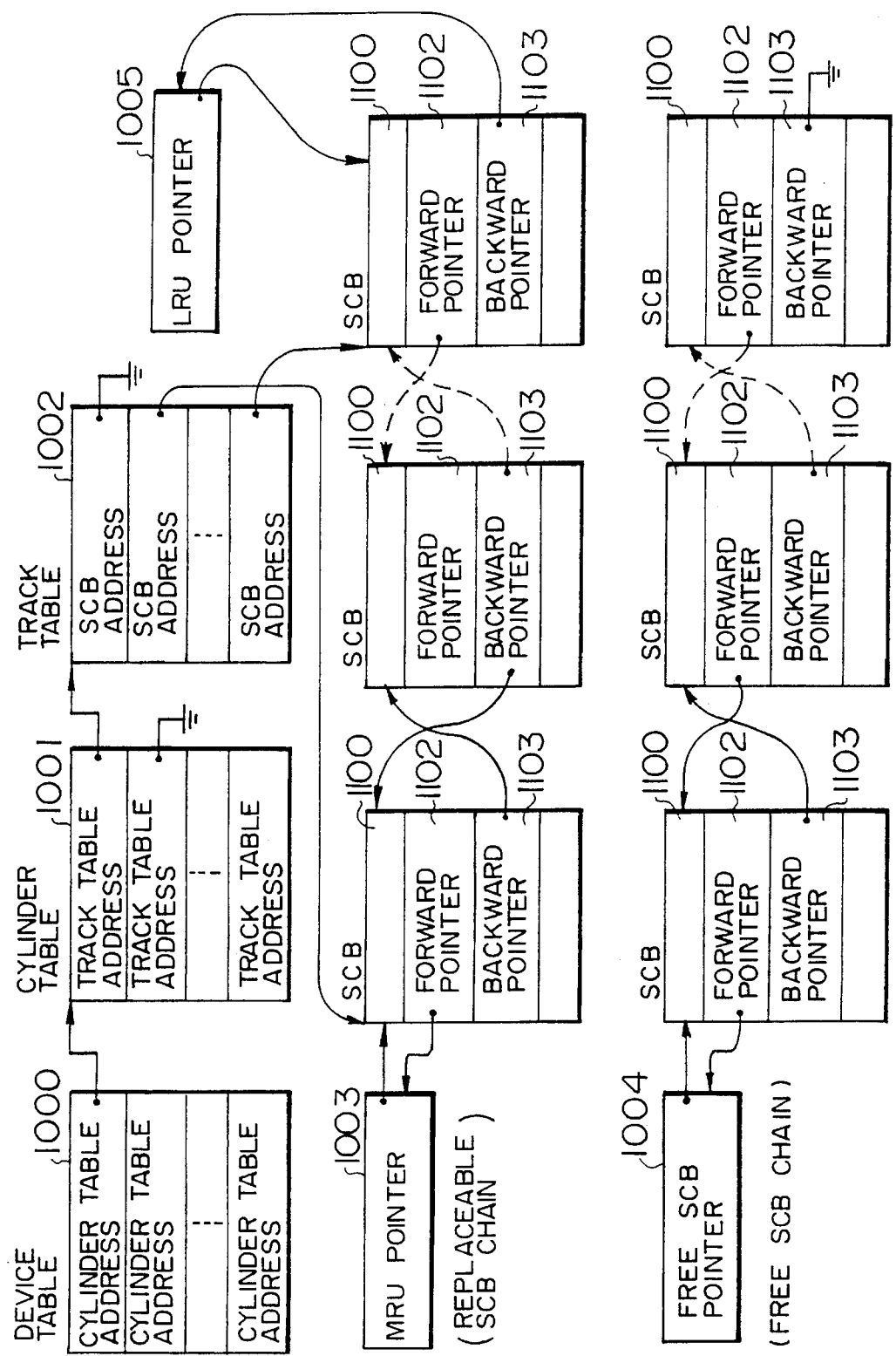
FIG. 11 schematically represents a relationship between a Hit/Miss judgement table.

FIG. 11 represents a relationship between the Hit/Miss judge table and the slot control block (SCB). It should be understood that the cache memories 22 and 23 are duplicated cache memories whose contents are identical to each other. In FIG. 11, earth symbols connected to the entries of the device table 1000, the cylinder table 1001 and the SCB 1100 represent that a "null" has been set to each of these entries. When "null" has been set to an entry, it implies that there is no further information. For example, when "null" is set to the second entry of the cylinder table 1001, it implies that all data of the CKD tracks for constituting this second entry are not present on the cache memories. A judgement as to whether or not a CKD track to be accessed is present on the cache memories 22 and 23, may be made by retrieving the device table 1000, cylinder table 1001, and track table 1002 based on the device number, cylinder number, and track number of the CKD disk unit to be emulated.

The SCB 1100 for managing the cache slots containing no update data among the SCB 1100 pointed to from the track table 1002, is chained by an MRU (Most Recently Used) pointer 1003 an LRU (Least Recently Used) pointer 1005, a forward pointer 1102, and a backward pointer 1103. This chain is referred to as a replaceable SCB chain. The forward pointer 1102 and the backward pointer 1103 of the SCB 1100 connected to the replaceable SCB chain, chains the SCB 1100 allocated to the CKD track in the MRU order. The MRU pointer 1003 points to the SCB 1100 corresponding to the CKD track which has become most recently an input/output target from the central processing unit 1, whereas the LRU pointer 1005 points the SCB 1100 corresponding to the CKD track which has not become an input/output target for the longest time. When the corresponding cache slot becomes a target to be accessed by the central processing unit 1, each of these SCB 1100 is inserted after the MRU pointer 1003.

The SCB 1100 for managing the cache slots which are not allocated to the CKD track is chained by a free SCB pointer 1004, a forward pointer 1102, and a rear pointer 1103. The free SCB pointer 104 is a head pointer used to chain the SCBs 1100 for managing the cache slots which are not allocated to the CKD track, and points out one of these SCBs 1100. The SCBs 1100 for managing the remaining cache slots which are not allocated to the CKD track, are chained with the forward pointer 1103 and the backward pointer 110. When there is no SCB for managing the cache slots which are not allocated to the CKD track, the free SCB pointer 1004 becomes "null".

When a "Miss" is determined by way of the Hit/miss judgement process at the step 901, a slot allocate process used to allocate the cache slot for the CKD track is carried out (step 902). In the slot allocate process, when the free SCB 1100 is present, the SCB 1100 pointed to by the free SCB pointer 104 is allocated to the CKD track to be accessed. When there is no free SCB 1100, namely the free SCB pointer is "null" the SCB 1100 pointed from the CRU pointer 1005 is allocated to the CKD track to be accessed.

When a "Hit" is determined at the step 901, or after the process operation defined at the step 902 has been completed, a read start FBA block number on the FBA disk unit 3 is calculated at the step 903. The read start FBA block number on the FBA disk unit 3 may be calculated based on the below-mentioned formula with employment of a cylinder number 803, a track number 804, and a sector number 805 within RB80:

FBA block number 32 (cylinder number×track number within cylinder×FBA block number for constituting CKD track+(track number×FBA block number for constituting CKD track)+($\nabla$(sector number×size of 1 sector)/size of FBA block $\nabla$), where symbol $\nabla$—$\nabla$ in the above calculation formula implies that number below a decimal point is discarded.

When the read start FBA block number is obtained, a data read request from the calculated FBA block number is issued (step 904). Subsequently, a data transfer is set up to the cache memories 22 and 23 (step 905). In the set-up process, addresses of the cache memories 22 and 23 which commence to store the FBA blocks and the number of transfer byte are set to the drive adapter 24. The storage start address of the FBA block corresponds to an address on the CKD track, corresponding to the first FBA block for executing the staging process. The number of the transfer byte is either the number of bytes in the relevant CKD track until the final type, or the number of bytes just before the backward FBA block where the staging process is being executed when the staging process of the backward FBA block has been performed.

When data transfer is commenced at the subsequent step 906, the drive adapter 24 stores the FBA blocks read out from the FBA disk unit 3 at the addresses on the set cache memories 22 and 23. The drive control processor 26 monitors the data transfer effected by the drive adapter 24, and when the data transfer is accomplished, the staging process is ended (step 907).

Figure 12:
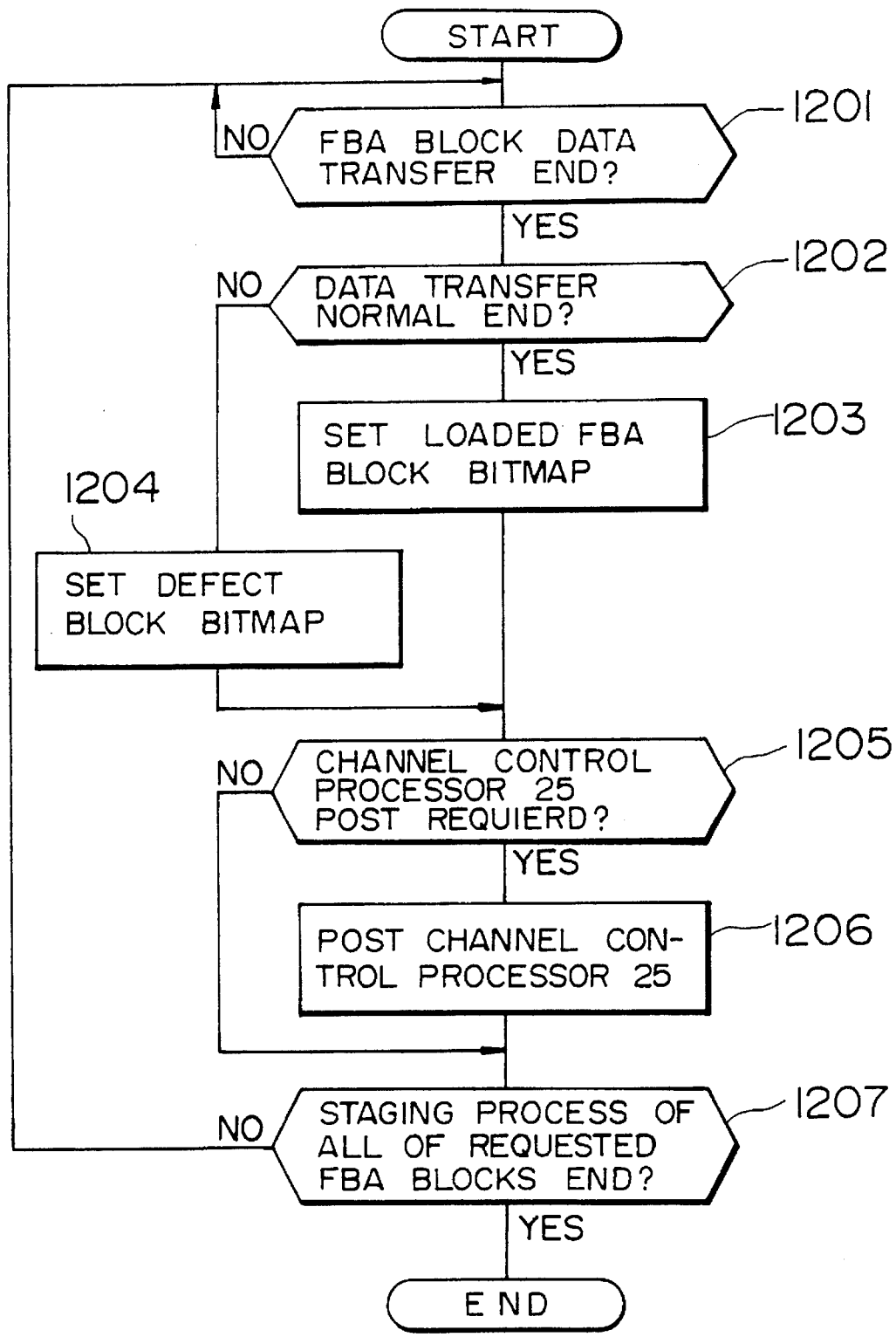
FIG. 12 is a flow chart for explaining in detail a data transfer process from the FBA disk unit to the cache memory.

FIG. 12 is a flow chart for explaining the process operation defined at the step 907 more in detail. When the drive adapter 24 transfers a single FBA block to the cache memories, the drive adapter 24 reports this transfer result to the drive control processor 24. The drive control processor 24 monitors the completion of the data transfer of the FBA block based on this report (step 1201). When the drive control processor 26 detects at the step 1201 that the data transfer of a single FBA block is completed, the drive control processor 26 judges whether or not the data transfer operation is performed under a normal condition. When the drive control processor 26 makes a judgement that the data transfer is correctly accomplished, the drive control processor 26 sets the bit corresponding to the FBA block in which the data transfer of the loaded bitmap 1108 within SCB 1100 is completed (step 1203). On the other hand, when it is judged that the data transfer of the FBA block is performed under an abnormal, or extraordinary, condition at the step 1202, the drive control processor 24 sets the bit corresponding to the FBA block in which the data transfer of the defect FBA block bitmap 1111 within SCB 1100 is performed under the abnormal condition (step 1204).

Next, another judgement is made as to whether or not the post control is required for the channel control processor 25 (namely, whether or not the bit is set into the post control block bitmap 1110 of SCB 1100). This judgement is carried out by AND-gating the post control block bitmap 1110, which has been set when the channel control processor 25 within SCB 1100 issues the load request, and either the loaded FBA block bitmap 1108, or the defect FBA block bitmap 1111. If this result is not equal to zero, then a judgement is made that the post process is requested for the channel control processor 25, and then the post process is performed at a step 1206. To the contrary, if the result is equal to zero, the process operation skips over the post process of the step 1206. At the step 1206, the process for posting the channel control processor 25 is carried out to clear the post control block bitmap 1110. Thereafter, a judgement is made as to whether or not the staging processes of all FBA blocks requested from the channel control processor 25 have been completed (step 1207). As a result of this judgement, when there is an FBA block required for the staging process, the process operation is returned to the step 1201. When the staging processes for all FBA blocks have been ended, this process operation is accomplished.

While the staging process is carried out by the drive control processor 26, the drive channel control processor 25 may monitor as to whether or not the CKD record to be accessed by the central processing unit 1 has been loaded on the cache memories with reference to SCB 1100. Then, as a result of the monitoring operation, if the drive channel control processor 25 recognizes that the CKD record to be accessed has been loaded on the cache memories, the relevant CKD record loaded on any one of the cache memories with a light load is transferred to the central processing unit 1. As a result, the data on the cache memories 22 and 23 can be transferred to the central processing unit 1 in conjunction with the data transfer process from the FBA disk unit 3 to the cache memories 22 and 23.

[DATA UPDATING PROCESS]

Figure 13:
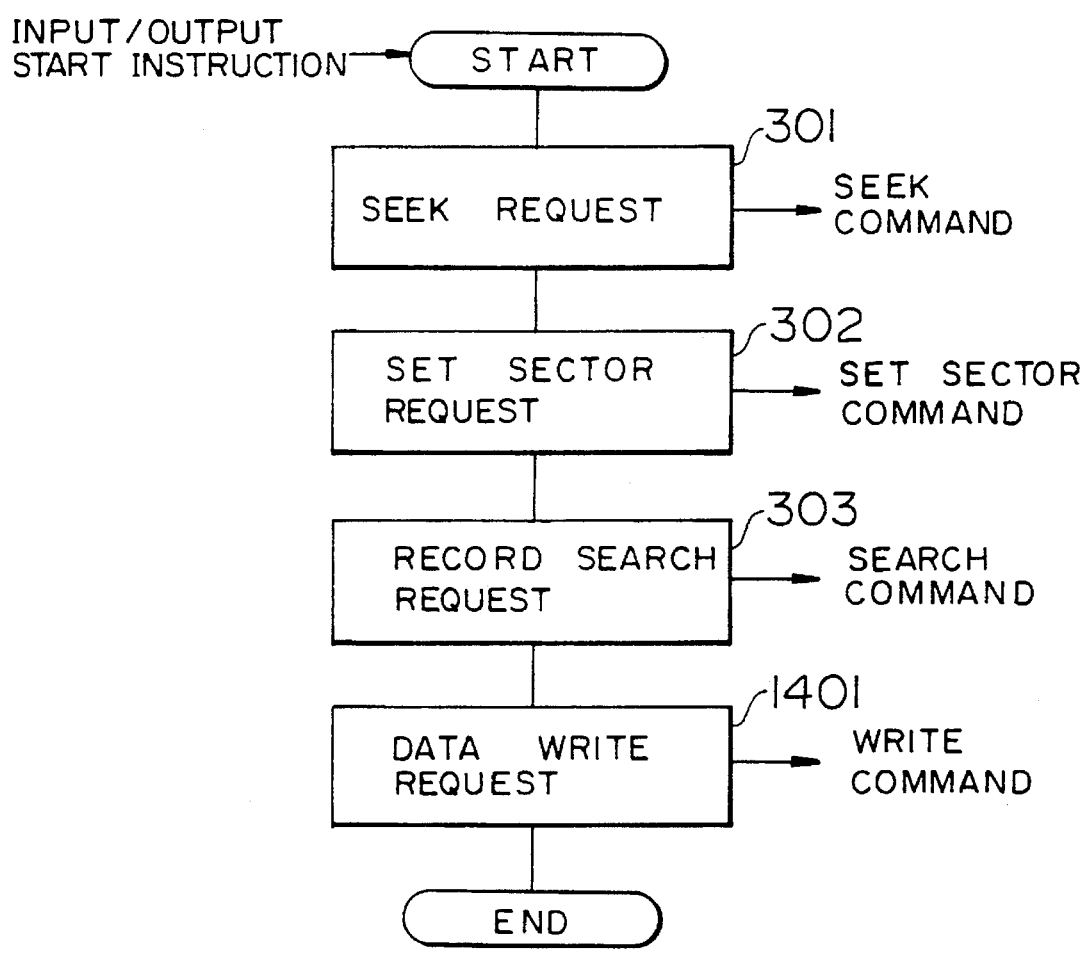
FIG. 13 is a flow chart of a channel program employed in a data write process.

FIG. 13 is a flow chart for explaining the operation of a channel program used to update data on an external storage unit by the program 10. In the data updating process, a check is performed as to whether or not a CKD record to be processed for the data update is present in the cache memories 22 and 23 in steps 301 to 303. Then, if no CKD record to be updated is present in the cache memories 22 and 23, the channel control processor 25 transfers the load request by RB80 to the drive control processor 26. The drive control processor 26 controls the drive adapter 24 in response to the load request, and reads out the FBA blocks containing the CKD records to be accessed from the FBA disk unit 3, thereby storing these FBA blocks into the cache memories 22 and 23. It should be noted that the process operations performed at these steps 301 to 303 are carried out in accordance with the previously explained read process in a similar manner, and therefore no further explanation thereof is made in the following description.

When the process operations as defined from the step 301 to the step 303 are accomplished under a normal condition, the channel processor 12 of the central processing unit 1 transfers a write command to the disk controller 2 in order to update the CKD record based on the data stored in the main storage unit, thereby executing the data write request (step 1401). A process operation performed based on this write command will now be explained in detail.

[WRITE COMMAND PROCESS: step 1401]

Figure 14:
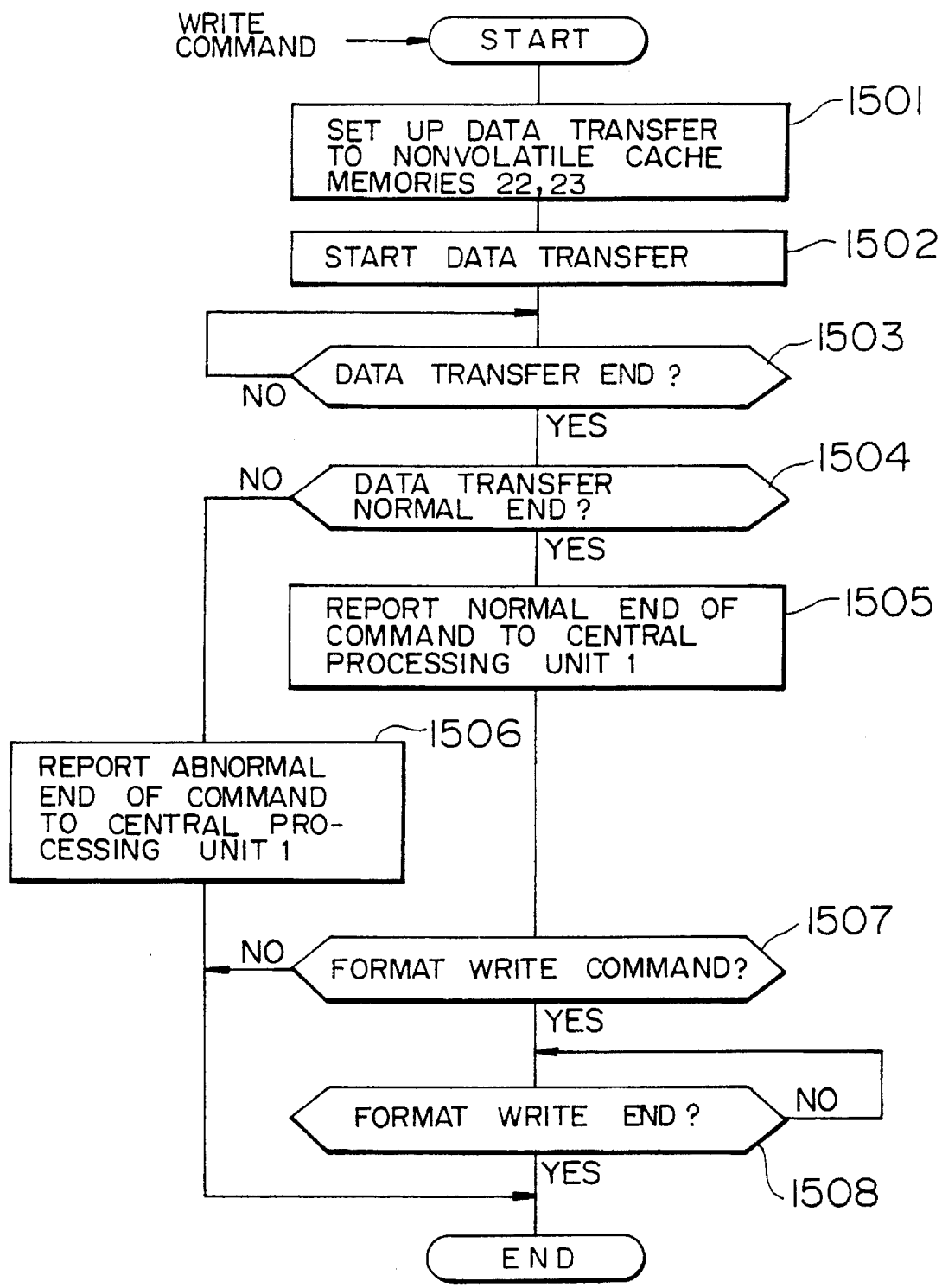
FIG. 14 is a flow chart of a write command process.

Upon receipt of the write command, the channel control processor 25 executes the write command process. A flow chart of the write command process is shown in FIG. 14. In the write command, first, a data transfer operation is set up to the cache memories 22 and 23 (step 1501). In the set up process, a storage address and a transfer byte number of a CKD record to which data is transferred are set to the channel adapter 21. The storage address of the CKD record is used to set an address of a field within the CKD record retrieved during a search command process (step 303 of FIG. 14). Here, a selection is made from a control field, a key field, and a data field as an address to be set, depending upon the sort of write command. For instance, if the received write command corresponds to a "WRITE DATA" command being a data update request command of a data portion, both of a head address of the relevant data field and a length of the data field stored in the control field are set into the channel adapter 21. It should be understood that, when the received write command corresponds to a write command having a format to perform an initialization of the CKD track (for example, a WRITE COUNT, KEY, AND DATA command etc.), such a setting operation is carried out to delete the data subsequent to the CKD records designated by the relevant CKD track.

After the step up process, the channel control processor 25 instructs a commencement of a data transfer operation to the channel adapter 21 (step 1502). Upon receipt of the start instruction of the data transfer, the channel adapter 21 stores the data transferred from the central processing unit 1 into the regions on the cache memories 22 and 23, indicated by the CKD record storage addresses set at the step 1501. The channel control processor 25 monitors the data transfer effected by the channel adapter 21 and waits for the completion of the data transfer process (step 1503).

Figure 15:
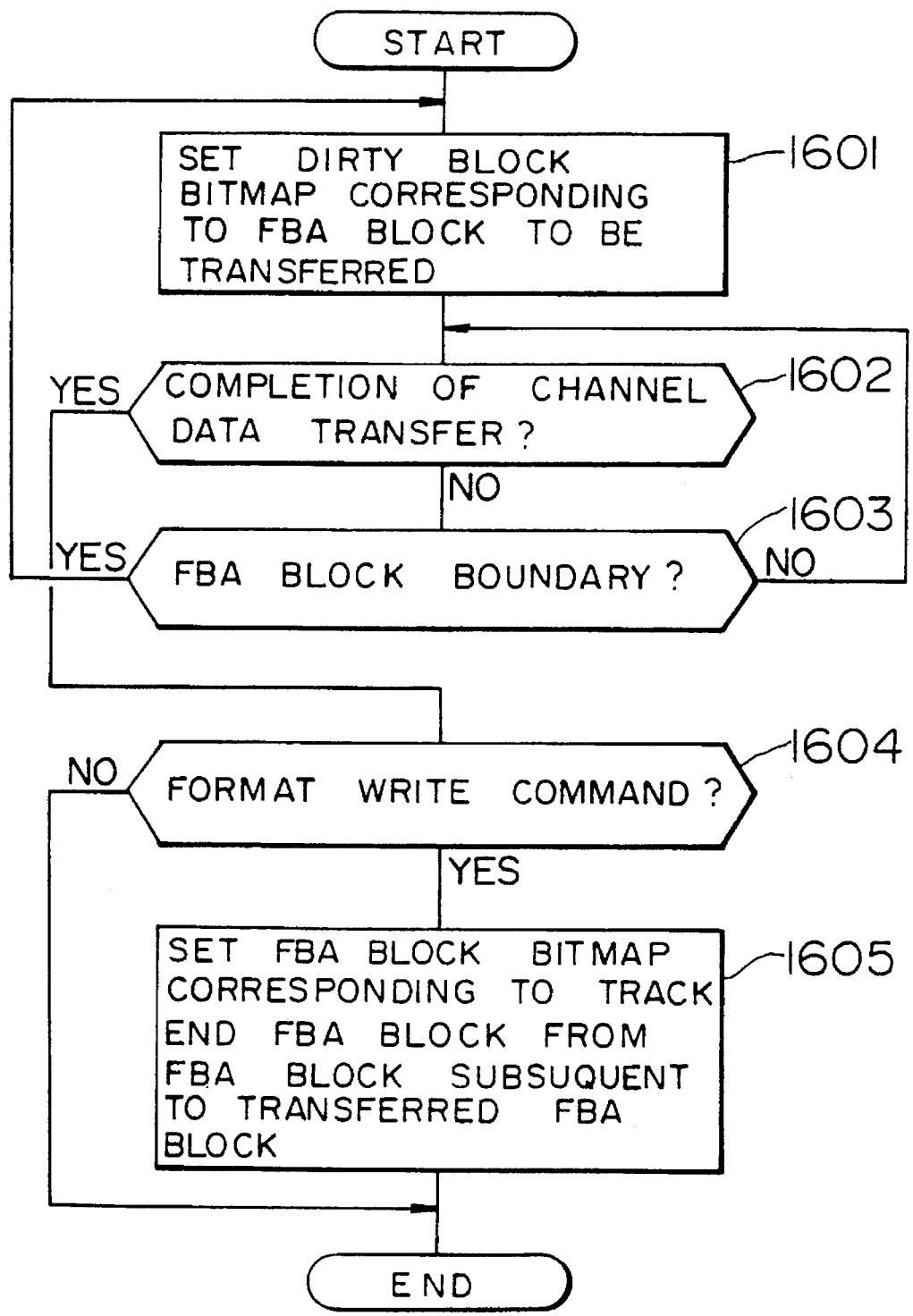
FIG. 15 is a flow chart for explaining in detail a data update process to an FBA block within the cache memory.

FIG. 15 represents in detail the process to judge the completion of the data transfer operation defined at the step 1503. First, in the process to judge the completion of the data transfer operation, a setting operation is made of a bit corresponding to the FBA block to be transferred on the dirty block bitmap 1109 within SCB1100, and it is recorded that this FBA block has been updated (step 1601). Subsequently, a check is done as to whether or not the transfer operations of all FBA blocks to be updated have been accomplished, in other words, whether or not the channel data transfer operation has been ended (step 1602). When it is judged that the channel data transfer operation has not yet been ended, another check is made as to whether or not the data transfer has reached the boundary of the FBA block (step 1603). As this judgement result, when it is so judged that the data transfer has reached the boundary of the FBA block, the process operation is returned to the step 1601 at which the dirty FBA block bitmap 1109 is updated when the data transfer of the subsequent block is commenced. If it is judged at the step 1603 that the data transfer has not yet reached the boundary of the FBA block, the process operation is returned to the step 1602 at which a judgement is obtained as to whether or not the channel data transfer is accomplished.

Upon detection of the completion of the channel data transfer at the step 1602, a check is made as to whether or not the data update request issued from the central processing unit 1 corresponds to a format write command (step 1604). When the data update request issued from the central processing unit 1 corresponds to the format write command, a bit corresponding to the last FBA block of the CKD track to be accessed is set from an FBA block subsequent to the FBA block where the data transfer of the dirty FBA block bitmap 1109 is accomplished (step 1605). This is because the CKD records subsequent to the CKD record to be accessed must be erased in case of the format write command, and the data of the FBA block into which the CKD record to be erased has been stored is erased, namely updated. In this case, the erasing process of this CKD record is automatically executed by the channel adapter 21.

When the data transfer operations (steps 1502 and 1503) have been completed, as described above, the channel control processor 25 judges whether or not the data transfer operation has been completed under a normal condition (step 1504). When it is so judged that the data transfer operation has been performed under an abnormal condition, the channel control processor 25 reports the abnormal completion of the write command process to the central processing unit 1 (step 1506). When it is so judged that at the step 1504 the data transfer operation is ended under a normal condition, the channel control processor 25 reports the normal end of the write command process to the central processing unit 1 (step 1506). When it is judged at the step 1504 that the data transfer operation has been ended under a normal condition, the channel control processor 25 reports the normal completion of the write command process to the central processing unit 1 (step 1505). If the data transfer operation has been completed under a normal condition, thereafter another check is performed as to whether or not an input/output request process issued from the central processing unit 1 corresponds to the format write command (step 1507). When a judgement is made that the input/output request process issued from the central processing unit 1 is the format write command, the process operation is accomplished after the format write process executed by the channel adapter 21 has been completed (step 1508). Also, if a judgement is made that the input/output request process issued from the central processing unit 1 corresponds to a data update request other than the format write request, then the process operation is immediately completed.

Also in the data update process similar to the data write process, the channel control processor 25 monitors the execution conditions of the staging process to the cache memories with reference to SCB 1100, and controls the channel adapter 21 when the CKD record to be accessed is loaded on the cache memories, whereby the data transferred from the central processing unit 1 is stored into the cache memories 22 and 23. As a consequence, it is possible to store the update data from the central processing unit 1 into the cache memories 22 and 23 in conjunction with the staging process of the CKD record derived from the FBA disk unit 3, which is to be updated.

[STORAGE PROCESS OF UPDATED DATA INTO FBA DISK UNIT]

In the above-explained data update process, the data on the cache memories 22 and 23 is merely updated, but the updated data is not written into the FBA disk unit 3. The data which has been updated on the cache memories 22 and 23, is stored into the FBA disk unit 3 during a later proper period. In this embodiment, the response time of a write command is shortened by performing such a control. Since the two cache memories 22, 23 and the control memory 27 are non-volatilized, there is no risk that the updated data is erased, or disappears due to power source troubles until the updated data is stored into the FBA disk unit 3. To reflect an updated content into the FBA disk unit 3, a storage process of updated data on the cache memories 22, 23 into the FBA disk unit 3 is performed in asynchronism with an update request issued from the central processing unit 1, which will now be described as follows.

Figure 16:
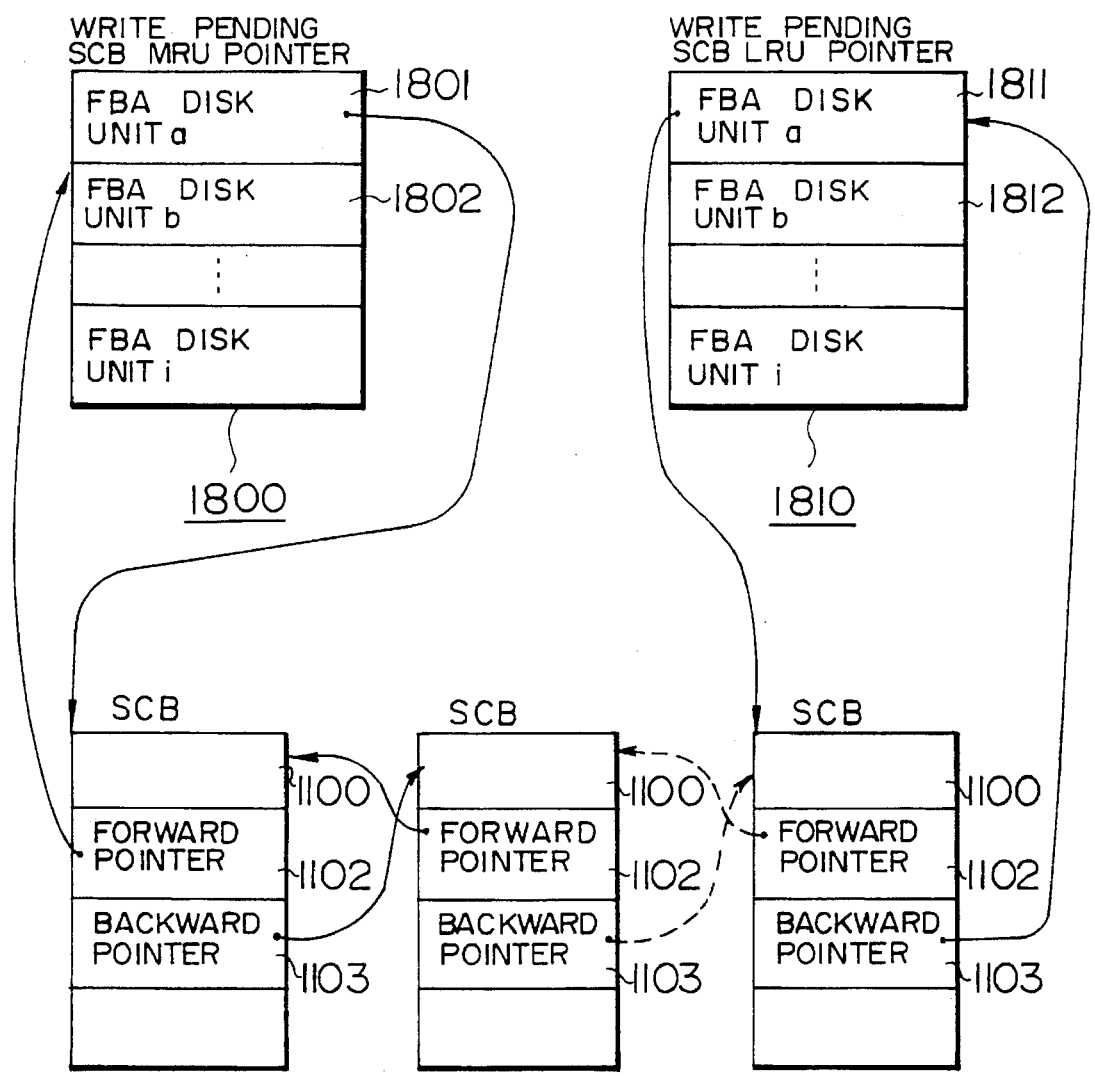
FIG. 16 schematically illustrates a write pending SCB chain for managing cache slots containing update data.

FIG. 16 schematically illustrates an arrangement of a write pending SCB chain constructed of SCB 1110 for managing cache slots containing updated data which have not yet been reflected into the FBA disk unit 3 (referred to as a "write pending SCB"). The write pending SCB 1100 is chained with a write pending SCBMRU pointer 1800, a write pending SCBLRU pointer 1810, and a forward pointer 1102 and also a backward pointer 1103 provided within SCB 1100. Write pending SCB chains are present, depending on the respective FBA disk units, when a plurality of FBA disk units are provided. A register process of SCB 1100 to the write pending SCB chain is performed when the data updating process is carried out in the channel control processor 25. SCB 1100 corresponding to the cache slot containing the newly updated data is registered to the MRU side of the write pending SCB chain.

The drive control processor 26 initiates the destaging process for storing the updated data on the cache slot into the FBA disk unit 3 when the write pending SCB is present and manages this cache slot. When there are plural write pending SCBs on the write pending SCB chain, the destaging process is sequentially carried out from the write pending SCB at the LRU side.

[DESTAGING PROCESS]

Figure 17:
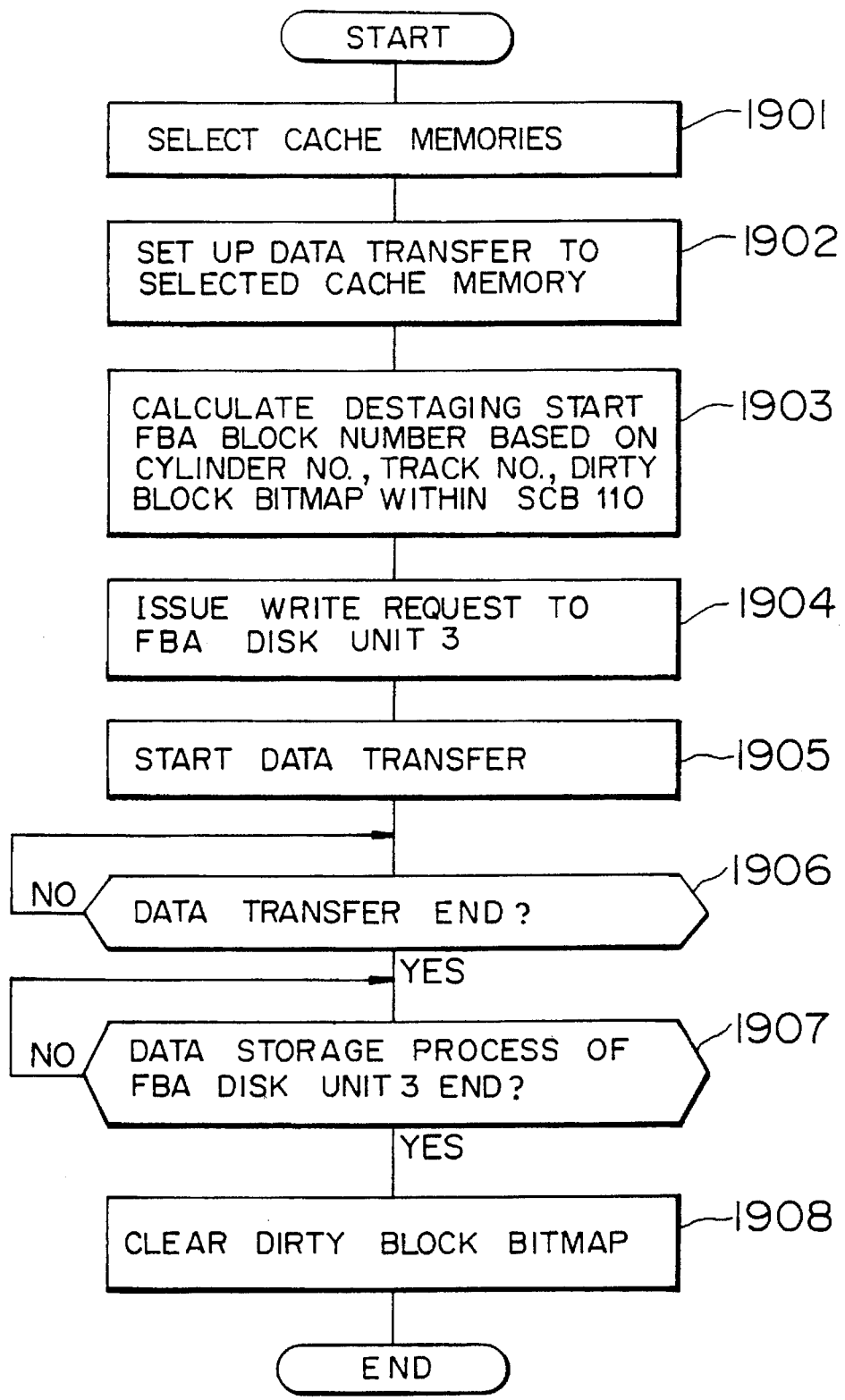
FIG. 17 is a flow chart for explaining a destaging process.
Figure 18:
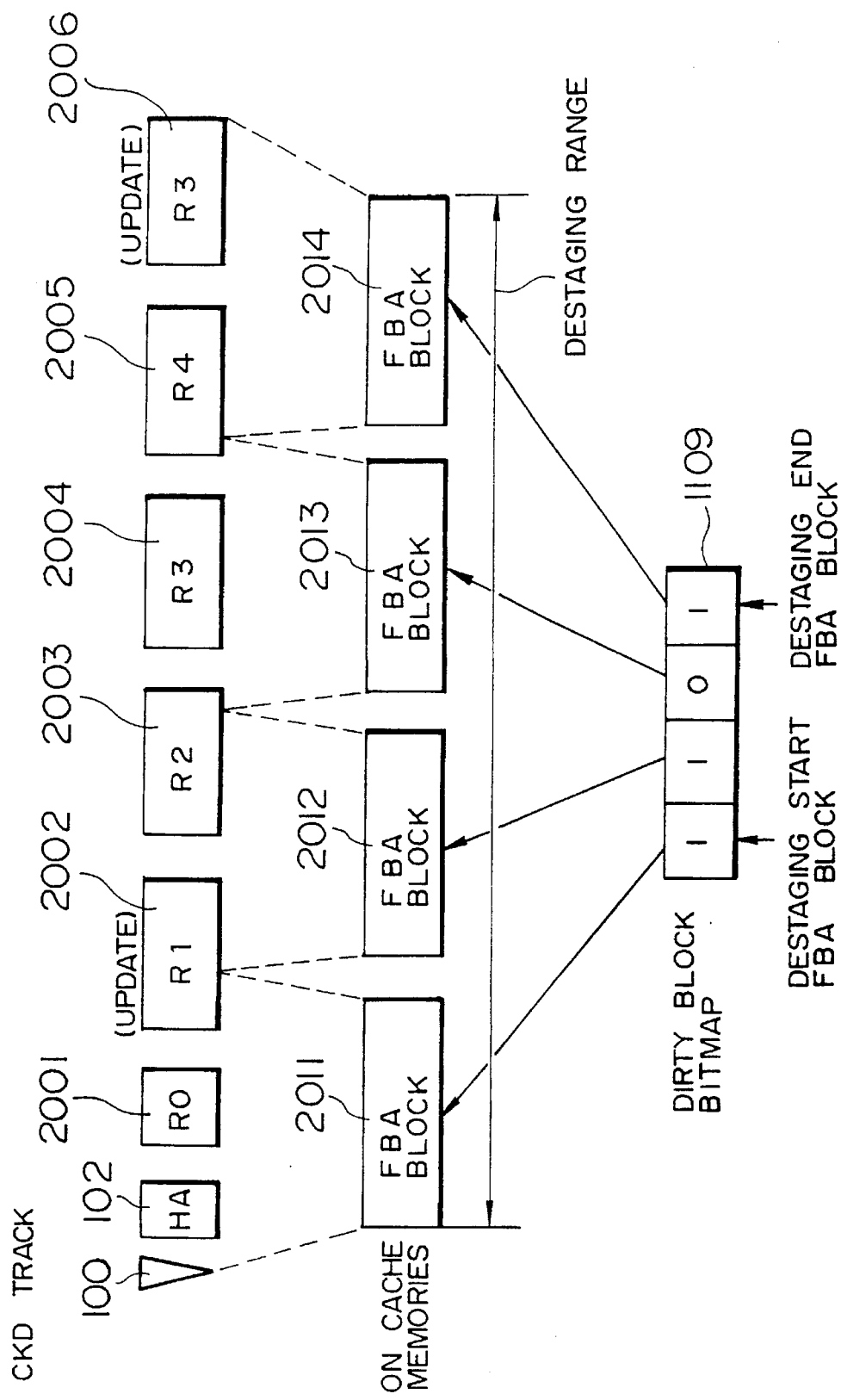
FIG. 18 is an explanatory diagram for explaining a range of FBA blocks which should be destaged.

In FIG. 17, there is shown a flow chart of the destaging process. In this destaging process, first, one of the cache memories 22 and 23 is selected (a step 1901), and the data transfer is setup to the selected cache memory (step 1902). During the set up process, both of a storage address and a transfer byte number of the FBA block within the cache memory, to which the data is transferred, are set to the drive adapter 24. The storage address of the FBA block is obtained by referring to the dirty block bitmap 1109 in SCB 1100. The transfer byte number is set whose number is equal to the number of FBA blocks which contain the FBA block containing the first updated data in the CKD track to be destaged until the FBA block containing the last updated data. This destaging process will now be summarized with reference to FIG. 18. FIG. 18 illustrates that 6 CKD records (2001 to 2006) are present within a certain CKD track, and these CKD records are stored in the FBA blocks 2001 to 2014 on the cache memories 22 and 23. Assuming now that the CKD records 2002 and 2006 have been updated by the central processing unit 1, it implies that the contents of the FBA blocks 2011, 2012 and 2014 are updated on the cache memories. The dirty block bitmap 1109 represents that the bits corresponding to the FBA blocks 2011, 2012, 2014 become "1", and the updated data is contained in these FBA blocks. In the destaging process, 4 continuous FBA blocks from the FBA block 2011 to FBA block 2014 are to be destaged. As described above, since such an un-updated FBA block sandwiched by the updated FBA blocks is also to be destaged, for example, even when SCSI is employed as the interface of the FBA disk unit 3, the write command is issued only once to the FBA disk unit 3, whereby the destaging process can be performed.

Subsequent to the set up process at the step 1902, an FBA block number for commencing the destaging process is calculated from the cylinder number 1105, the track number 1106, and the dirty block bitmap 1109 within SCB 1100 (step 1903). Thereafter, an instruction is made to commence the data transfer (step 1905) and the completion of the data transfer is monitored (step 1906). When the completion of the data transfer is detected at the step 1906, an announcement of the completion of the data storage process issued from the FBA disk unit 3 is monitored (step 1907). At the step 1907, when the report on the completion of the data storage process is received from the FBA disk unit 3 and the completion of the data storage process is detected, the dirty block bitmap 1109 corresponding to the FBA block from which the data storage process into the FBA disk unit 3 is completed, is cleared. The SCB 1100 for managing the cache slots where the destaging processes has been accomplished, is released from the write pending SCB chain, and is inserted just after the MRU pointer 1003 of the replaceable SCB chain.

In accordance with the above-described first embodiment, all of the FBA blocks containing the CKD records required to be accessed from the central processing unit are stored in the nonvolatile cache memories. As a consequence, even when a defect happens to occur in one cache memory during the destaging process, the destaging process can be restarted from the other cache memory. As a consequence, in the FBA disk unit, even when the CKD disk unit would be emulated, there is no risk to destroy the records other than the records to be accessed from the central processing unit. Accordingly, even when the CKD disk unit would be emulated in the FBA disk unit, the write-after-cache method may be applied i which performs the data storage process to the FBA disk unit in asynchronism with the data update request issued from the central processing unit.

Also, according to this embodiment, the data transfer operation between the FBA disk unit and the cache memories may be executed in parallel with the data transfer operation between the cache memories and the central processing unit, and furthermore, since the exclusive unit is the FBA block, the time period, after the input/output request has been received from the central processing unit until the data transfer is actually commenced, may be shortened.

In the above-described first embodiment, the CKD records to be accessed from the central processing unit 1 are continuously stored in both of the cache memories 22 and 23. However, originally, a cache slot containing no update data may be present, or stored in only one of these cache memories. Thus, it is difficult to effectively utilize the cache memory in the above-explained first embodiment. Now, a description will be made of a managing method for effectively utilizing two cache memories 22 and 23 as a second embodiment of the present invention. It should be noted that a system arrangement of the second embodiment of the present invention is similar to that of the first embodiment, and therefore the system arrangement of FIG. 1 of the first embodiment may be directly utilized to in second embodiment. Accordingly, explanations of this system arrangement according to the second embodiment are omitted.

Figure 19:
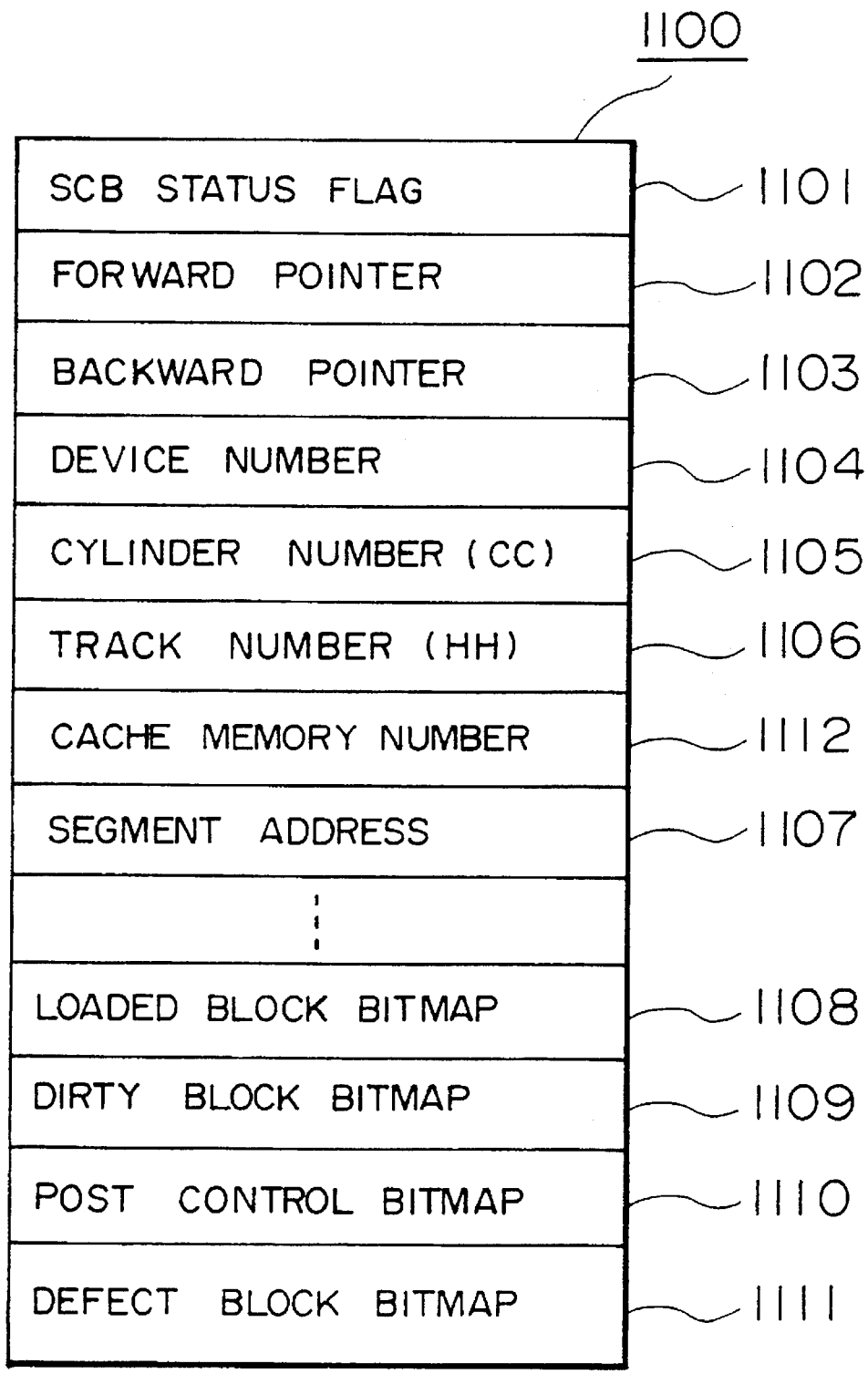
FIG. 19 is a structural diagram for showing a slot control block (SCB) according to a second embodiment of the present invention.

In this second embodiment, a slot control block (SCB) for managing cache slots on the cache memories is independently provided in each of the cache memories. As a result, an arrangement of the SCB is shown in FIG. 19. The slot control block (SCB) according to the second embodiment has an entry indicative of a cache memory number to which a cache slot managed by this SCB belongs, namely has a cache memory number 1112, which is different from the SCB shown in FIG. 9 of the first embodiment. The cache memory number is a serial number allocated to a plurality of cache memories employed in the disk controller 2. In this second embodiment, "0" is allocated to the cache memory 22 and "1" is allocated to the cache memory 23. A CKD type data storage format and a data storage format on the cache memories have a relationship, as shown in FIG. 2, similar to that of the first embodiment. The SCB 1100 for managing the cache slots on the cache memory "0" 22, is managed by the Hit/Miss judge table constructed of the device table 1000-0, the cylinder table 1001-0, and the track table 1002-0, whereas the SCB 1100 for managing the cache slots on the cache memory "1" 23 is managed by the Hit/Miss judge table constructed of the device table 1000-1, the cylinder table 1001-1, and the track table 1002-1.

Figure 20:
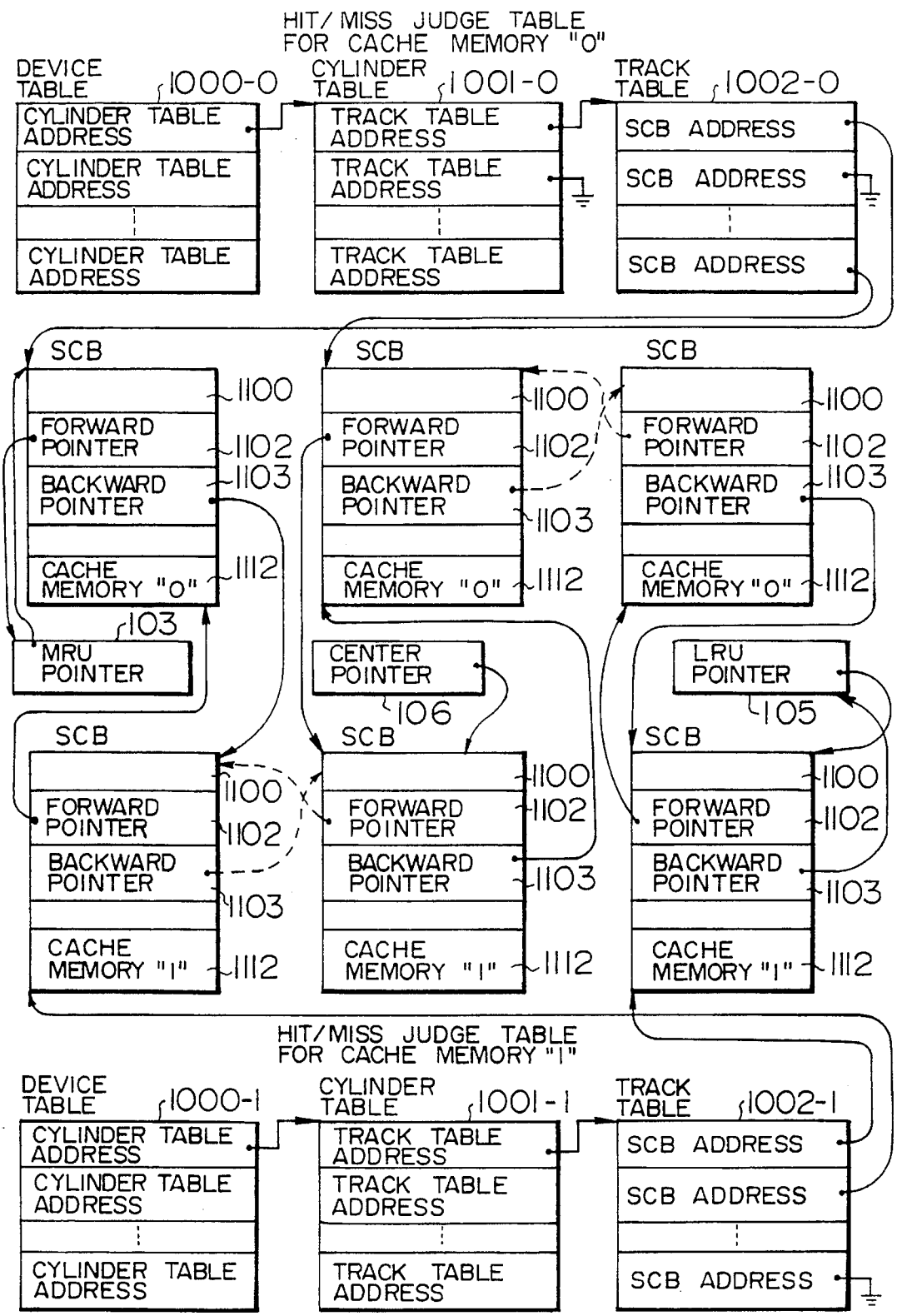
FIG. 20 schematically shows a relationship between SCB and a Hit/Miss judgement table in the second embodiment.

In FIG. 20, there is shown a relationship between a Hit/Miss judge table and SCB 1100, which are employed so as to judge whether or not the CKD track accessed from the central processing unit 1 is present in either the cache memory 22, or the cache memory 23. As represented in FIG. 20, in this embodiment, a Hit/Miss judge table is constructed of device tables 1000-0, 1000-1; cylinder tables 1001-0, 1001-1; and track tables 1002-0, 1002-1 for each of the cache memories.

The SCB 1100 pointed to by the track tables 1002-0 and 1002-1 is used to manage the cache slots containing the updated data, and is connected to a replaceable SCB chain. The replaceable SCB chain is managed by the MRU pointer 1003, the LRU pointer 1005, and the forward pointer 1102/backward pointer 1103 within the SCB 1100. This chain is constructed of a single chain, irrelevant to the cache memories "0" and "1". The SCB 1100 positioned at a center of the chain is pointed to by a center pointer 106. At the time when the access operation from the central processing unit 1 is completed, if the cache slots for storing the CKD tracks to be accessed are present in both of the cache memory "0" and the cache memory "1" the SCB 1100 for managing one cache slot is connected to the MRU side of the replaceable SCB chain, and the SCB 1100 for managing the other cache slot is connected to the chain position indicated by the center pointer 1006. It should be noted that arrows for indicating points from the track tables 1002-0 and 1002-1 are omitted with respect to some of the SCB in FIG. 20.

Figure 21A:
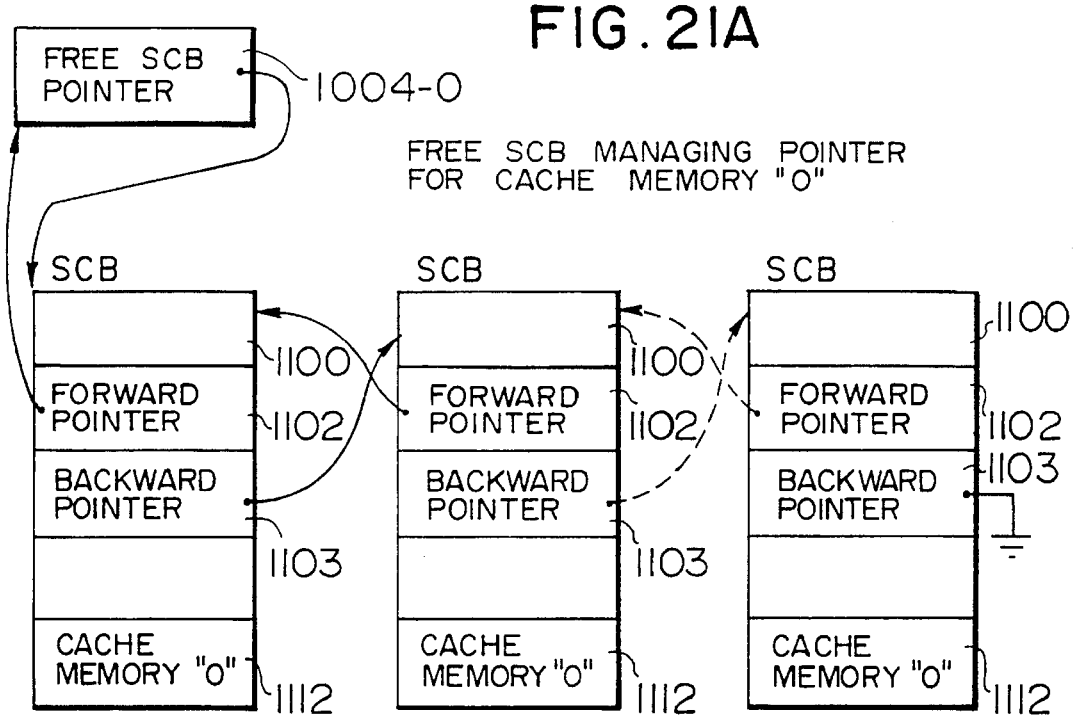
FIGS. 21A and 21B are schematic diagrams for indicating an empty SCB chain used to manage cache slots which have not yet be allocated to CKD tracks in the second embodiment.
Figure 21B:
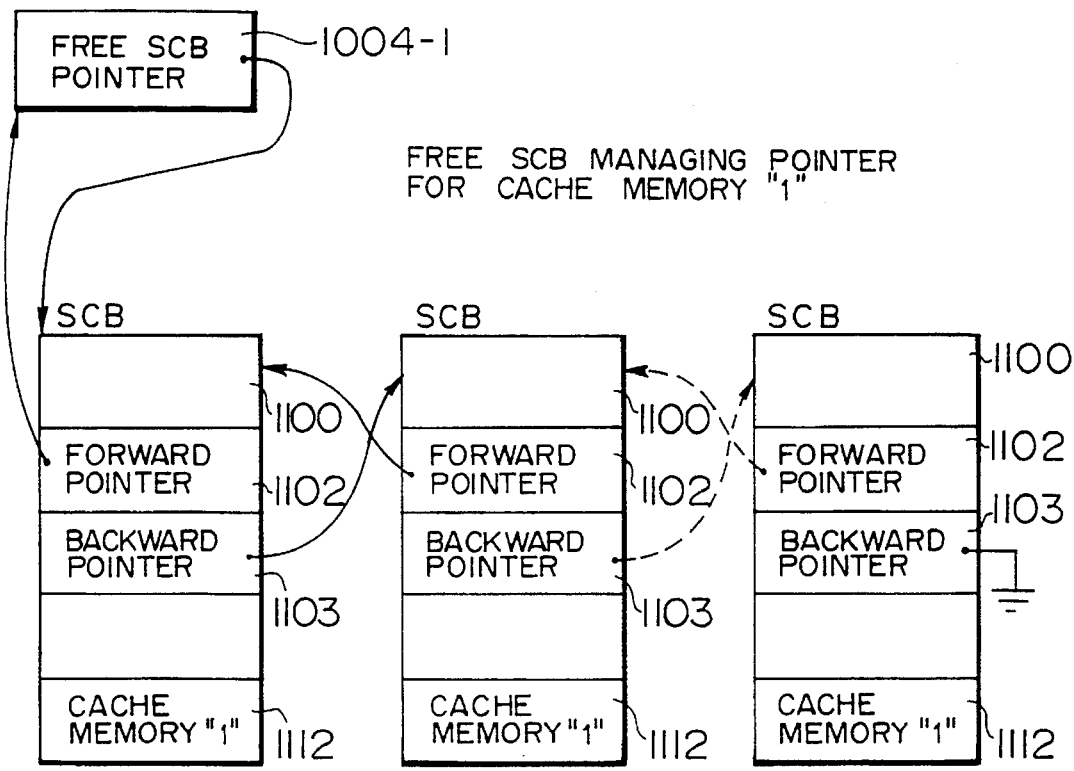

FIG. 21 represents a structural diagram of a free SCB chain for managing a cache slot which is not allocated for a CKD track in the second embodiment. To the free SCB chain, the SCB 1100 corresponding to the cache slot which is not allocated to the CKD track (i.e., newly allocatable to CKD track) for each cache memory, is chained as a free SCB pointer. The SCB 1100 for managing free cache slots on the cache memory "0" is chained with the forward pointer 1102 and the backward pointer 1103, while the free SCB pointer 1004-0 is positioned as a head. On the other hand, the SCB 1100 for managing the free cache slots on the cache memory "1" is chained with the forward pointer 1102 and the backward pointer 1103, while the free SCB pointer 1004-1 is located as a head. In case all of the cache slots have been allocated to the CKD tracks, the values of the free SCB pointers 1004-0 and 1004-1 become "null". When a new cache slot is required in response to the input/output request issued from the central processing unit 1, if there is a free SCB connected to the free SCB chain, then a cache slot corresponding to this free SCB is utilized. When the value of the free SCB pointer becomes "null" the SCB 1100 at the LRU side (i.e., SCB indicated by LRU pointer), registered in the replaceable SCB chain, is utilized.

[DATA READ PROCESS]

Basically, a data read process according to the second embodiment is performed in a similar manner to the data read process according to the first embodiment as shown in FIG. 3. In this embodiment, since the cache memories 22 and 23 are independently managed, a search command process (namely, step 303 of FIG. 6) is partially different from the search command process of the first embodiment. A description will now be made of such a different process in this search command process.

Figure 22:
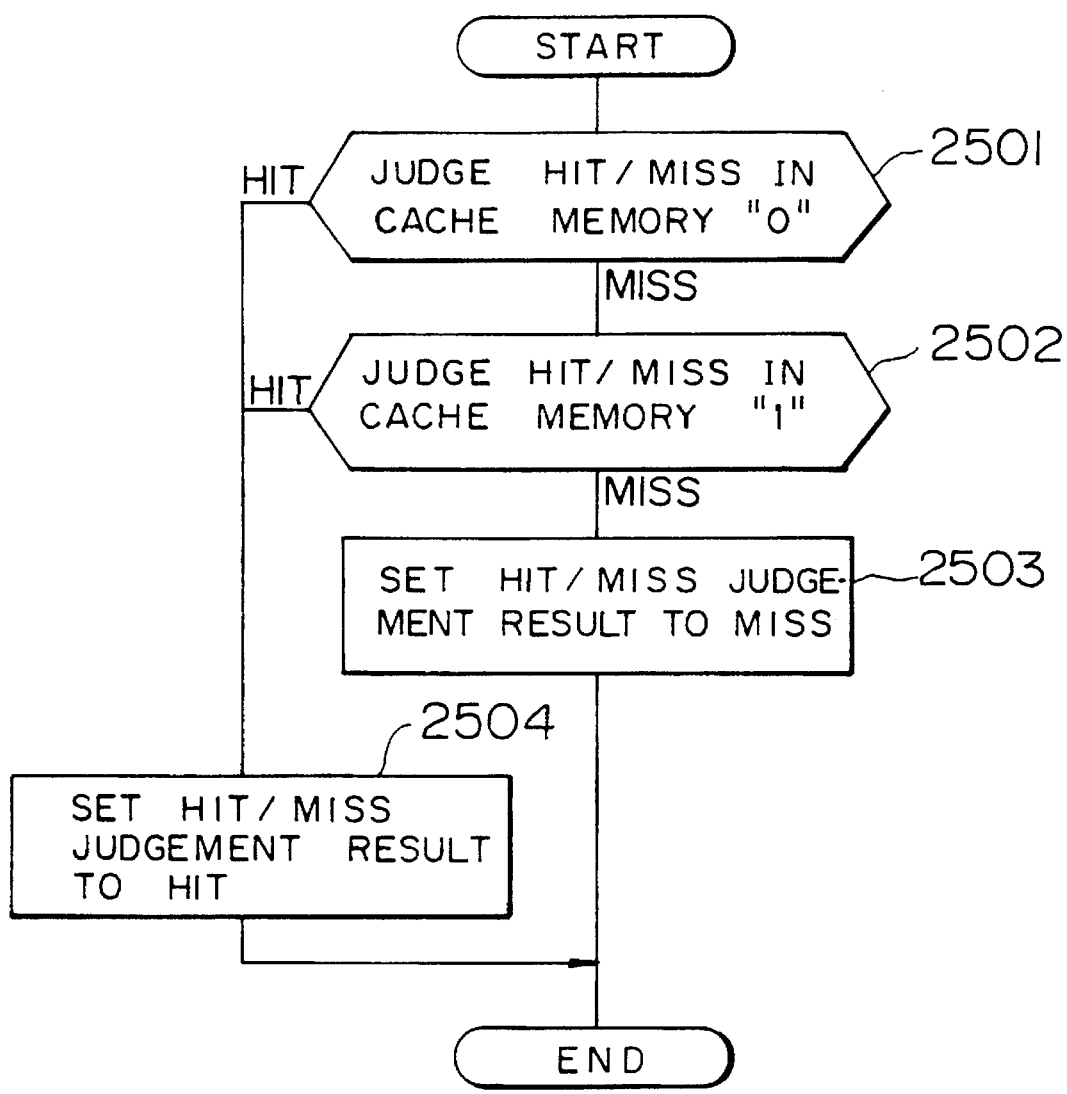
FIG. 22 is a flow chart for explaining a Hit/Miss judgement process in the second embodiment.

In the search command process of the second embodiment, first of all, the Hit/Miss judgement process of a CKD track (step 603 of FIG. 6) is different from that of the first embodiment. FIG. 22 represents a flow chart for explaining the Hit/Miss judgement process of the CKD track in this second embodiment. First, a check is made as to whether or not there exists the CKD track to be accessed from the central processing unit 1 (step 2501). When it is judged that no relevant CKD track is present on the cache memory "0" another check is performed as to whether or not there is the CKD track to be accessed from the central processing unit 1 on the cache memory "1" with reference to the Hit/Miss judge table used for the cache memory "1" (step 2502). As a result of this judgement, when no relevant CKD track is present in any of these cache memories, a Hit/Miss judgement result is set to "Miss". When it is so judged that the CKD track to be accessed is present in either the cache memory "0" or the cache memory "1" at the step 2501 or 2502, a Hit/Miss judgement result is set to "Hit". It should be noted in accordance with the Hit/Miss judgement process shown in FIG. 22, if the CKD track to be accessed is found to be present in both of the cache memories "0" and "1", then the cache memory "0" namely the cache memory 22 would be necessarily selected, whereby an unbalance happens to occur in loads between the cache memories 22 and 23. To solve such an unbalance problem, the Hit/Miss judgement sequence (namely, execution sequence of steps 2501 and 2502) for the cache memories "0" and "1" is substituted with each other in accordance with an odd number and an even number in the cylinder numbers in this second embodiment.

In a selection process (step 605 of FIG. 6) of the cache memories, the cache memory in which the CKD track to be accessed is present is selected for performing the subsequent process. Also, in a selection process (step 701 of FIG. 7) of the cache memories during a read command process of this embodiment, the cache memory in which there is the CKD record to be accessed is selected to execute the read command process in a similar manner to the cache memory selecting process in the search command process.

[DATA UPDATE PROCESS]

Basically, a data update process according to the second embodiment is performed in a similar manner to the above-explained data update process (FIG. 13) of the first embodiment, and a Hit/Miss judgement process executed during the data update process takes a different direction from the Hit/Miss judgement process of the first embodiment, which is similar to the above-described data read process. Furthermore, in the data update process, a process executed in a write command process (step 1401 of FIG. 13) is different from that of the first embodiment. In accordance with the second embodiment, there is a case in which a cache slot to be updated is present only in one cache memory. In this case, the process is performed in such a way that another cache slot is newly allocated to the other cache memory, and there are provided the FBA blocks in which the CKD records to be updated have been stored in both of the cache memories.

Figure 23:
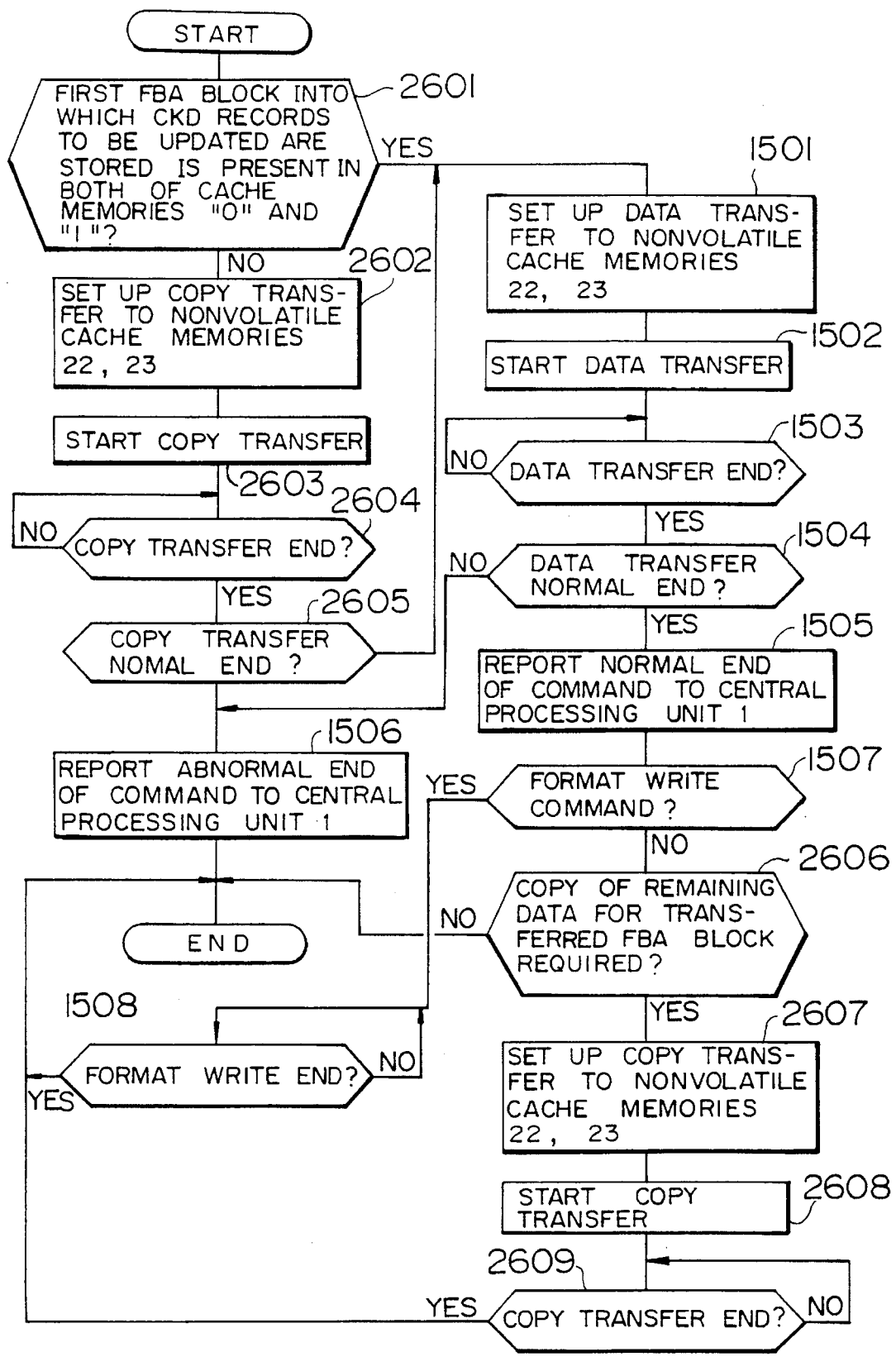
FIG. 23 is a flow chart for explaining a write command process in the second embodiment.
Figure 24:
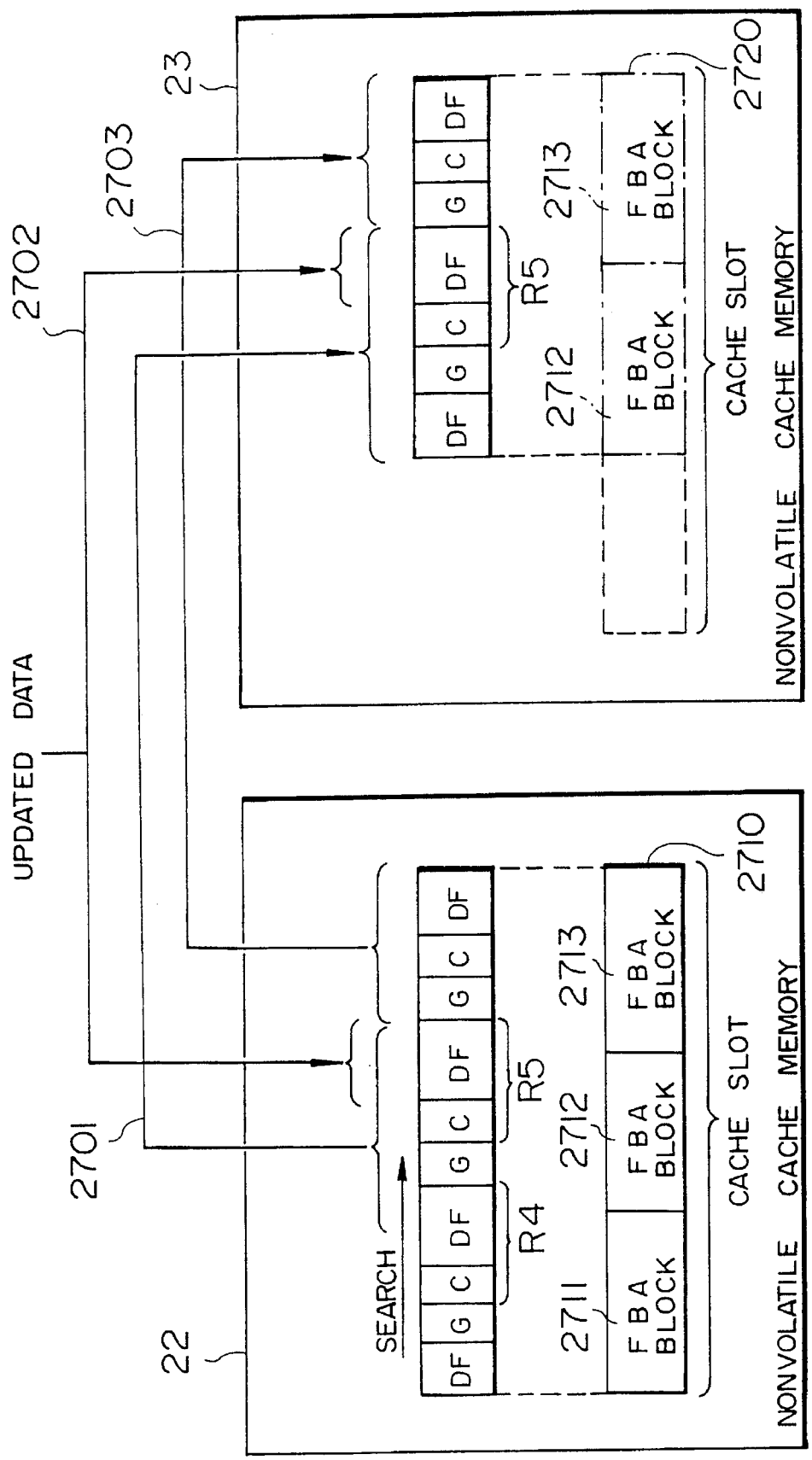
FIG. 24 is a data flow chart for representing a data flow in the write command process according to the second embodiment.

FIG. 23 is a flow chart for explaining the write command process in the second embodiment. FIG. 24 represents one example of a data flow in this write command process. In FIG. 24, there are exemplary shown one case where a cache slot 2710 for storing an FBA block containing a CKD record (R5) to be updated is present in the cache memory 22, and the other case where no FBA block containing a CKD record to be updated is present in the cache memory 23. In FIG. 23, the same reference numerals shown in FIG. 14 are employed as those for denoting the same process operation as in the first embodiment of FIG. 14.

Upon receipt of a write command from the central processing unit 1, the channel control processor 25 confirms whether or not the first FBA blocks into which the CKD records to be updated have been stored are stored in both of the cache memories "0" and "1" (step 2601). In FIG. 24, the object to be updated from the central processing unit is the data field of the CKD record (R5), and this CKD record is stored so as to bridge an FBA block 2712 and an FBA block 2713. At a step 2601, a judgement is made as to whether not the FBA block 2712 is present in both of the cache memory 22 and the cache memory 23. When it is judged that the FBA record having the CKD record to be updated is present only in one cache memory, a copy process between the cache memory 22 and the cache memory 23 is set up (step 2602). This set up process is constructed of the following two processes. In the first process, a cache slot having the same capacity as that of a cache slot functioning as a copy sender is reserved on the cache memory functioning as a copy receiver. In the second process, addresses of the cache memory as the copy sender and of the FBA block to be copied (namely, head FBA block containing CKD record to be updated), the cache memory as the copy receiver and an address thereof, and the byte number of the copy process are set into the channel adapter 21. For instance, in case of FIG. 24, the cache slot 2720 having the same capacity as that of the cache slot 2710 on the cache memory 22 is allocated to the cache memory 23. Thereafter, the head address of the FBA block 2712-0 within the cache slot 2710 is set as an address of the copy sender. Also, the head address of the FBA block 2712-1 is set as an address of the copy receiver, and furthermore a total byte number from the head of the FBA block 2712-0 to the data field of the CKD record R5 is set as the transfer byte number.

After the set-up process of the copy process has been completed, the channel control processor 25 instructs the channel adapter 21 to start the copy process (step 2603). As a result, the copy process (arrow 2701 of FIG. 24) is commenced. It should be noted that as the transfer byte number set in the set-up process, a total byte number from the head of the FBA block 2712-0 up to the count field (C) of the CKD record R5 may be set, otherwise, a total byte number until the final address of the FBA block 2713-0 may be set. The copy process between the cache memories is executed by a channel adapter 21. The channel control processor monitors the execution conditions of the copy process performed by the channel adapter 21, and judges whether or not the copy process is completed under a normal state (step 2605) upon detection of the completion of the copy process (step 2604). When it is judged that the copy process is completed under an abnormal state, the channel control processor reports the abnormal end of the write command to the central processing unit 1 to complete the copy process (step 1506). When it is so judged at the step 2601 that either the copy process is completed under a normal state, or the copy process is unnecessary, the process operation is advanced to a step 1501 at which the data transfer operation (arrow 2702 of FIG. 24) from the central processing unit 1 is executed. The process operations from the steps 1501 to the step 1502 are identical to those of the first embodiment, and explanations thereof are omitted.

When at the step 1507 it is judged that the write command issued from the central processing unit 1 does not correspond to the format write command, a check is made as to whether or not the remaining data in the FBA block from which the data transfer is completed must be copied between the cache memories (step 2606). For instance, in a case as shown in FIG. 24, the data transfer from the central processing unit 1 is ended half way through the data transfer for the FBA block 2713. Under this condition, it does not indicate that the FBA block 2713 is completely present on the two cache memories. Therefore, the data subsequent to the CKD record R5 of the FBA block 2713-0 is copied into the FBA block 2713-1, and the FBA block containing the updated data must be perfectly duplicated. When it is judged that the copy process is required, the channel control processor 25 executes the copy process (arrow 2703 of FIG. 24) at steps 1606 to 1609. The copy process executed in this case is carried out in the same sequence as the copy process executed in the steps from 2602 to 2604.

With the above-explained write command process, the FBA block for storing the CKD record to be update from the central processing unit 1 is present in both of the cache memories 22 and 23.

[DESTAGING PROCESS]

Similar to the first embodiment, a storage process of updated data from the cache memories 22 and 23 into the FBA disk unit 3, namely a destaging process is carried out in asynchronism with the data update request issued from the control processing unit 1 in accordance with the second embodiment. A management of write pending SCBs in this embodiment is performed by the write SCB chain as shown in FIG. 16 in a similar manner to that of the first embodiment. In accordance with the second embodiment, the duplicated cache slots under a write pending state are managed by way of the independent SCB 1100, and any one of them may be registered into the write pending SCB chain.

Figure 25:
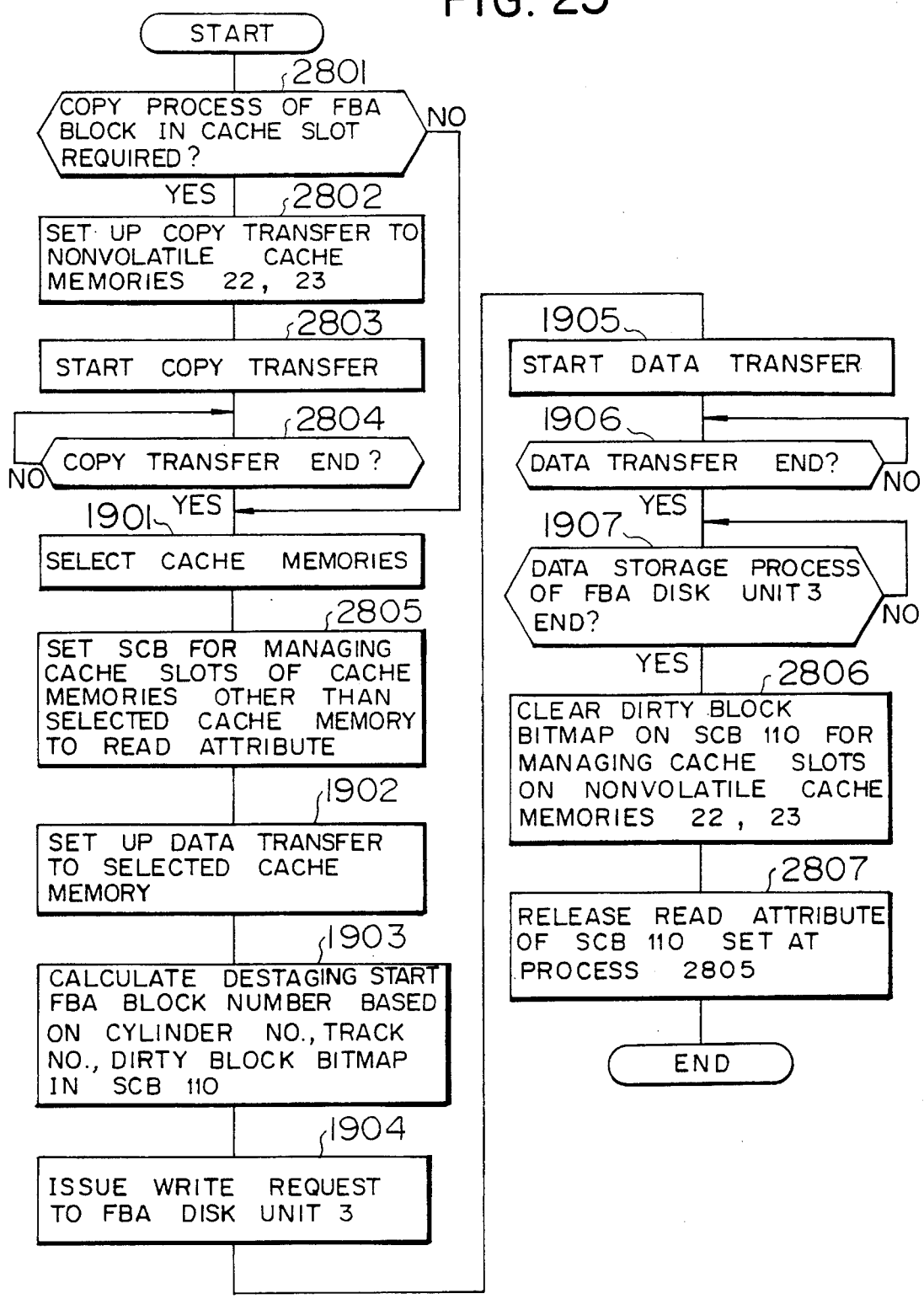
FIG. 25 is a flow chart for explaining a destaging process according to the second embodiment.
Figure 26:
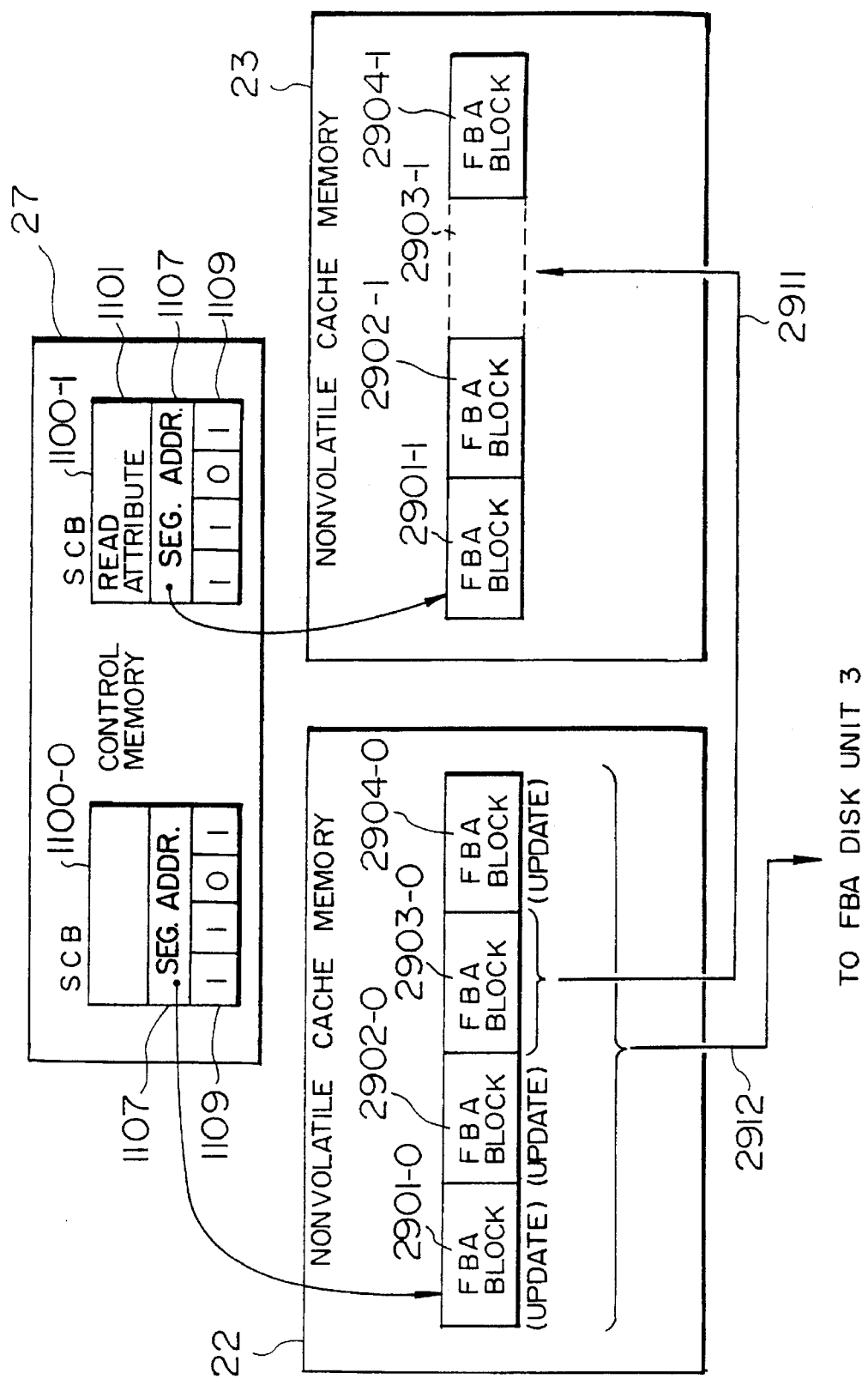
FIG. 26 is a data flow chart for indicating a data flow in the destaging process according to the second embodiment.

When the SCB 1100 corresponding to the cache slot under a write pending state is present, the drive control processor 26 reserves the SCB 1100 pointed to by the write pending SCBLRU pointer 1810 to perform the destaging process. In FIG. 25, there is shown a flow chart of the destaging process according to this second embodiment. In the destaging process, first, a check is performed as to whether or not the copy process is required between the cache memories of the FBA block within the cache slot (step 2801). In this embodiment, as in a case where a plurality of FBA blocks which are not continued within the cache slot have been updated, in order to perform the data update operation within the FBA disk unit 3 in response to a single write request to the FBA disk unit 3, the updated data within a single CKD track containing the FBA blocks which are not updated are entirely written. For instance, as represented in FIG. 26, it is assumed that a cache slot corresponding to a certain CKD track is constructed of 4 FBA blocks 2901 to 2904, updated dated data are contained in FBA blocks 2901, 2902, 2904, and an FBA block 2903 containing no update data is present only on the cache memory 22. In this case, all of the FBA blocks 2901 to 2904 are to be written into the FBA disk unit 3. If a defect happens to occur in the cache memories while the content of the FBA block 2903 is written into the FBA disk unit 3 under such a condition as shown in FIG. 26, the data stored in the FBA block 2903 will disappear. In accordance with this second embodiment, such a problem is solved by storing all of the FBA blocks into both of the cache memories, which are written into the FBA disk unit 3 containing the FBA block 2903. As a result, a confirmation is made at a step 2801 as to whether or not all of the FBA blocks belonging to a range for a block writing operation have been stored into both of the cache memories 22 and 23, so that it is judged whether or not the copy process is required between the cache memories.

When it is so judged at the step 2801 that the copy process between the cache memories is required, the drive control processor 26 sets up the copy process for the cache memories 22 and 23 (step 2802). In this set-up process, the cache memory functioning as a copy sender, the head address of the FBA block tt be transferred, the cache memory functioning as the copy receiver, and the byte number of the copy process are set into the channel adapter 21. Upon completion of setting up of the copy process, the drive control processor 26 instructs the drive adapter 24 to commence the copy process (step 2803). The copy process between the cache memories is executed by the drive adapter 24. The drive control processor 26 monitors the execution conditions of the copy process executed by the drive adapter 24 and waits for the completion of the copy process. When the completion of the copy process is detected at a step 2804, any one of these cache memories 22 and 23 is selected as the cache memory functioning as the copy sender to the FBA disk unit 3 (step 1901). Next, a read attribute flag is set to the SCB state flag 1101 within the SCB 1100 which manages the cache slot corresponding to the CKD track to be destaged on the non-selected cache memory (step 2805). This process is required in the following case. That is, when the access request is issued from the central processing unit 1 to the CKD track to be destaged during the destaging process to the FBA disk unit 3, if this access request corresponds to the data read demand, then the process operation of this access request can be performed by way of the cache slot which is not utilized in the destaging process. It should be noted that either if the access request issued from the central processing unit 1 corresponds to the data update request, or if the CKD record to be accessed is not present in the cache slot which is not utilized in the destaging process, the access request issued from the central processing unit is brought into a waiting condition until the destaging process is accomplished.

The process operations (step 1902 to 1907) subsequent to the step 2805 correspond to the write process into the FBA disk unit 3 containing the updated data on the cache slot. Since this write process is identical to that of the first embodiment, no further explanation thereof is made in the specification.

When the write process operation to the FBA disk unit 3 is completed, the dirty block bitmap 1109 within the SCB 1100 for managing the cache slots which have been completely written into the FBA disk unit 3, is erased (namely, bit is reset). This erasing process is applied to two SCBs 1100 for the duplicated cache slots. Finally, the read attribute of the SCB set at the step 2805 is released and then the process operation is ended (step 2807). It should be understood that the SCB 1100, for managing the cache slots in which the destaging process has been accomplished, is registered into the replaceable SCB chain. This registering process is carried out in such a manner that the SCB 1100 corresponding to one of the duplicated cache slots is registered to the MRU side of the replaceable SCB chain, whereas the SCB 1100 corresponding to the other duplicated cache slot is registered into a center of the replaceable SCB chain.

In accordance with this second embodiment, the cache slots just after read out from the FBA disk unit are duplicated on the two nonvolatile cache memories to be stored. In case no updated data is present on the cache slots and the frequency of access requests issued from the central processing unit 1 is low, the cache slots on one cache memory are deleted so as to be single-staged, and also there is no cache slot with a further low accessing frequency in any of these cache memories. As a result, the cache memories can be effectively utilized, and the higher probabilities can be expected that the data to be accessed from the central processing unit 1 will be present on the cache memories, so that the disk cache unit with high performance can be provided.

When the data update request is issued from the central processing unit 1, the FBA blocks containing the updated data are duplicated into the two nonvolatile memories. As a consequence, even when the CKD disk unit is emulated in the FBA disk unit, the write-after-cache control is applicable.

Furthermore, to reduce the quantity of write commands issued to the FBA disk unit, even when a plurality of FBA blocks containing the FBA blocks into which updated data on one cache slot are not stored are entirely written, since these FBA blocks are duplicated and stored into the two nonvolatile cache memories, there is no risk that this data will disappear even if a defect happens to occur during the write process to the FBA disk unit 3.

While the present invention has been described with reference to these concrete embodiments, the present invention is not limited thereto, but may be implemented in various forms without departing from the technical spirit and scope of the present invention.

We claim:

1. A storage control apparatus having a plurality of cache memories, connected between a central processing unit for executing a program with employment of a variable length block format type storage processing interface and a direct accessing type storage unit on which data is recorded in a fixed length block format, and for emulating a variable length block format type data storing process in said storage unit in response to channel commands for instructing a data transfer and a relevant operation of the data transfer performed between said storage unit and the central processing unit, said channel commands being issued from said central processing unit, said storage control apparatus comprising:

means for judging whether or not a fixed length block on said storage unit containing a record to be inputted/outputted by said channel commands, is stored in said plurality of cache memories;

means for selecting more than one cache memory other than a cache memory where said fixed length block is present and for allocating fixed length blocks to said selected more than one cache memory, when said judging means judges that said fixed length block on said storage unit containing said record to be updated is present in only one cache memory and when said channel commands request a data update;

means for copying at least a region containing said record to be updated within the fixed length block of said one cache memory, a region not containing said record to be updated, or all regions of said fixed length blocks;

means for storing an updated record from said central processing unit into the fixed length blocks of said one cache memory and said selected cache memory; and means for reporting a completion of said channel commands to said central processing unit at a time when said updated record is stored.

2. A storage control apparatus as claimed in claim 1, further comprising:

means, responsive to said channel commands being a data read request and said judging means judging that a fixed length block containing a record to be read is not stored into any one of said plural cache memories, for reading out said fixed length block containing said record to be read out from said storage unit, and for storing said read fixed length block into more than one cache memory among said plurality of cache memories;

means for selecting any one of said cache memories into which said fixed length block containing said record to be read has been stored; and means for reading said read record from the cache memory selected from said selecting means and for transferring said read record to said central processing unit.

3. A storage control apparatus as claimed in claim 1, further comprising:

means, responsive to said channel commands being a data update request and said judging means judging that a fixed length block containing said record to be updated is not stored into any one of said plural cache memories, for reading the fixed length block containing said record to be updated from said storage unit and for storing said read record to be updated into more than two cache memories among said plural cache memories;

means for storing the updated record from said central processing unit into the fixed length blocks containing all of said records to be updated for the cache memories for storing therein the fixed length block containing said records to be updated; and means, for announcing an end of said channel command to said central processing unit at a time when said updated record is stored.

4. A storage control apparatus as claimed in claim 1, further comprising:

means responsive to said channel commands being a data read request and said judging means judging that a fixed length block on said storage unit containing a record to be read is present in said plural cache memories, for selecting one of said plural cache memories; and means for reading out said record to be read from the cache memory selected by said selecting means.

5. A storage control apparatus as claimed in claim 1, further comprising:

means, responsive to said channel commands being a data update request and said judging means judging that a fixed length block on said storage unit containing said record to be updated is present in more than two cache memories, for storing the updated data from said central processing unit into the fixed length blocks containing all of said records to be updated of the cache memories into which the fixed length blocks containing said records to be updated are present; and means for reporting an end of said channel command to said central processing unit at a time when said updated records have been stored into more than two cache memories.

6. A storage control apparatus as claimed in claim 1, further comprising:

means for determining that the fixed length blocks for storing said updated records, which are in the form of updated blocks, are not continued on said cache memories, and that a fixed length block for storing therein no updated records, which are in the form of not yet updated blocks, is present between an updated block and another updated block; and means, responsive to said determining means determining that the not yet updated blocks are present only in one cache memory, for copying the not yet updated blocks on said one cache memory into a cache memory where the updated blocks are present, other than said one cache memory.

7. A storage control apparatus as claimed in claim 1, further comprising:

means, responsive to the fixed length blocks for storing therein said updated records on said cache memory being stored into said storage unit, for selecting one of said cache memories into which said fixed length blocks have been stored;

means for writing on said storage unit the fixed length blocks for storing therein said updated records on a cache memory selected by said selecting means; and means for performing the data read request issued from said central processing unit based on other cache memories not selected by said selecting means.

8. A disk control apparatus having two cache memories, connected between a central processing unit for executing a program with employment of a variable length block format type storage processing interface and a direct accessing type disk unit with a fixed length format, and for emulating a variable length block format type data storing process in said disk unit in response to a channel command for instructing a data transfer and a relevant operation of the data transfer performed between said disk unit and the central processing unit, said channel command being issued from said central processing unit, said disk control apparatus comprising:

means responsive to a record being read out from said disk unit for storing said read record into each of said two cache memories;

means responsive to a record stored in one of said cache memories being updated for commonly updating said record in both of said cache memories; and means responsive to a record stored in one of said cache memories being erased for commonly erasing the said record in both of said cache memories.

9. A storage control method for a storage control apparatus connected between a central processing unit having an interface for accessing a first disk unit on which data constructed of a plurality of variable length data records are recorded in a first recording format, and a second disk unit on which data constructed of a plurality of fixed length data blocks are recorded in a second recording format, and including a plurality of cache memories constructed of a plurality of first-level storage regions each having a storage capacity equal to a track of said first disk unit, the first-level storage region being composed of a plurality of second-level storage regions each having a second storage capacity equal to a fixed length block of said second recording format, said storage control method comprising the steps of:

judging whether or not data of a fixed length data block containing a variable length data record to be updated is present in each of said plurality of cache memories in response to a data update request from said central processing unit;

when a result of said judgement indicates that there are cache memories where no data of the fixed length data blocks containing the variable length data records to be updated is present, storing the data of said fixed length data blocks containing the variable length data records to be updated in said plurality of cache memories having no data of the fixed length blocks; and updating the data of the variable length data records to be updated which have been stored in said plurality of cache memories having no data of the fixed length blocks.

10. A storage control method as claimed in claim 9, wherein said storing step includes the steps of:

judging whether or not said first-level regions allocated as the tracks of said first disk unit containing the variable length data records to be updated, are present on said plurality of cache memories;

when a judgement is made that there is no relevant first-level storage region, allocating the first-level storage regions as the tracks of said first disk unit containing the variable length data records to be updated onto said plurality of cache memories;

judging whether or not the data of the fixed length data blocks containing the variable length data records to be updated are present within said first-level regions allocated as the tracks of said first disk unit containing the variable length data records to be updated; and when a judgement is made that there is no data of said variable data blocks, storing the data of said fixed length data blocks into said second-level regions within said first-level regions corresponding to said fixed length data blocks.

11. A storage control method as claimed in claim 9, wherein said storing step stores into said second-level regions, a data portion other than the data of the variable length data records to be updated within the fixed length data blocks containing at least said variable length data records to be updated.

12. A storage control method as claimed in claim 9, wherein said step of updating the data is a step for selecting one cache memory among said plurality of cache memories containing the updated data; and said strong control method further comprises a step of storing the data stored into said second-level regions and containing the updated data within said selected cache memory, into the corresponding region within said second disk unit.

13. A storage control method as claimed in claim 12, wherein said step of storing data into said second disk unit includes storing data in a continuous region involving a second-level region containing said updated data, and another second-level region containing no updated data, which is sandwiched by the second-level regions containing said updated data.

14. A storage control method as claimed in claim 13, wherein said step for storing into said second disk unit comprises the steps of:

judging whether or not the corresponding data of the fixed length blocks within said second disk unit is present in the second-level regions containing no said updated data;

upon determining that the corresponding data of the fixed length blocks is not present, transferring said corresponding data of the fixed length block from the second disk unit to the second-level regions containing no said updated data; and storing within said second disk unit data in a continuous region involving said second-level regions containing said updated data and said second-level regions containing no said updated data.

15. A storage control method as claimed in claim 9, further comprising the steps of:

selecting such a cache memory where the data of the fixed length blocks containing the variable length data records to be read are present in response to a data read request issued from said central processing unit; and transferring the data of the variable length data records to be read from said selected cache memory to said central processing unit.

16. A storage control method as claimed in claim 15, further comprising the steps of:

when the fixed length blocks containing the variable length data records to be read are not present in any of said plurality of cache memories, reading the data of the fixed length blocks containing the variable length data records to be read from said second disk unit; and storing the data of the read fixed length blocks into at least one of said plurality of cache memories.

17. A storage control apparatus connected between a central processing unit and a storage unit for storing therein data utilized in said central processing unit, said storage control apparatus comprising:

first and second cache memories having a plurality of regions for holding a portion of the data stored in said storage unit;

first managing means for managing an empty region among said plurality of regions within said first and second cache memories, the region in said first cache memory and the region in said second cache memory is not allocated to said data stored in said storage unit;

second managing means for managing a region capable of being allocated to other data within said storage unit, among the regions allocated to said data of the storage unit in said plurality of regions within said first and second cache memories, said second managing means managing the region in said first cache memory and the region in said second cache memory, which mutually contain the same data, in such a manner that said regions of the first and second cache memories are allocated to said other data at different priority orders;

means for judging whether or not, in response to a data access request issued from said central processing unit, the data to be accessed are present on said first and second cache memories;

means, responsive to a judgement result of said judging means indicating that no data to be accessed is present in any of said first and second cache memories, for reserving regions of said first and second cache memories for said data to be accessed with reference to said first and second managing means;

means for reading the data to be accessed from said storage unit to store the read data into said reserved regions of said first and second cache memories; and means for executing a process with respect to the data to be accessed, which has been stored into said cache memories in response to the data access request issued from said central processing unit.

18. A storage control apparatus as claimed in claim 17, wherein said access request is a request for updating the data within said storage unit.

19. A storage control apparatus as claimed in claim 18, further comprising:

third managing means for managing a region containing data updated in response to said update request among said plurality of regions within said first and second cache memories; and means for storing the data of the region managed by said third managing means, into said storage unit.

20. A storage control apparatus as claimed in claim 19, further comprising:

means for transferring from said third managing means to said second managing means, the management of the regions within said first and second cache memories, which have stored the data corresponding to the data stored in said storage unit by said storing means.

21. A storage control apparatus as claimed in claim 17, wherein said first and second cache memories are comprised of nonvolatile storage elements.

22. A storage control apparatus as claimed in claim 17, wherein said first and second cache memories are comprised of nonvolatile storage elements backed up by a battery power source.

23. A storage control apparatus connected between a storage unit for storing data and a central processing unit for utilizing the data stored into said storage unit, said storage control apparatus comprising:

a plurality of cache memories;

means for reproducing data on said storage unit and for storing the reproduced data into plural ones of said plurality of cache memories in a redundant manner; and means for varying the degree of redundantly reproducing the data for storing said data in said plural cache memories based on the frequency of access to the data by said central processing unit.

24. A storage control apparatus as claimed in claim 23, wherein said cache memories are nonvolatile cache memories.

\* \* \* \* \*